US008633474B2

(12) United States Patent
de la Vega et al.

(10) Patent No.: US 8,633,474 B2
(45) Date of Patent: Jan. 21, 2014

(54) PHOTOVOLTAIC DEVICE HAVING TRANSPARENT ELECTRODE FORMED WITH NANOPARTICLES

(75) Inventors: Fernando de la Vega, Zichron Yacov (IL); Moira M. Nir, Moreshet (IL); Arkady Garbar, Burnsville, MN (US)

(73) Assignee: CIMA Nanotech Israel Ltd. (IL)

( * ) Notice: Subject to any disclaimer, the term of this patent is extended or adjusted under 35 U.S.C. 154(b) by 479 days.

(21) Appl. No.: 12/808,619

(22) PCT Filed: Dec. 19, 2008

(86) PCT No.: PCT/US2008/013925
§ 371 (c)(1),
(2), (4) Date: Apr. 8, 2011

(87) PCT Pub. No.: WO2009/085224
PCT Pub. Date: Jul. 9, 2009

(65) Prior Publication Data
US 2011/0175065 A1        Jul. 21, 2011

Related U.S. Application Data

(60) Provisional application No. 61/015,483, filed on Dec. 20, 2007.

(51) Int. Cl.
*H01L 35/24* (2006.01)
(52) U.S. Cl.
USPC .................................. 257/40; 257/E51.001
(58) Field of Classification Search
USPC ............................................ 257/40, E51.001
See application file for complete search history.

(56) References Cited

U.S. PATENT DOCUMENTS

| 5,476,535 | A  | 12/1995 | Khasin |
| 6,812,399 | B2 | 11/2004 | Shaheen et al. |
| 6,933,436 | B2 | 8/2005  | Shaheen et al. |
| 6,951,770 | B2 | 10/2005 | Middelman et al. |
| 7,022,910 | B2 | 4/2006  | Gaudiana et al. |
| 7,777,303 | B2 | 8/2010  | Alivisatos et al. |
| 8,197,718 | B2 | 6/2012  | Nakahara et al. |
| 2004/0150326 | A1 | 8/2004 | Shibata |
| 2004/0187911 | A1 | 9/2004 | Gaudiana et al. |
| 2005/0215689 | A1 | 9/2005 | Garbar et al. |
| 2005/0224779 | A1 | 10/2005 | Wang et al. |
| 2007/0153362 | A1 | 7/2007  | Gruner |
| 2009/0061213 | A1 | 3/2009  | Bahnmuller et al. |

FOREIGN PATENT DOCUMENTS

| JP | 2000090745 A | 3/2000 |
| JP | 2000285737 A | 10/2000 |
| JP | 2004228057 A | 8/2004 |
| JP | 2005530005 A | 10/2005 |

(Continued)

OTHER PUBLICATIONS

Coakley et al., "Conjugated Polymer Photovoltaic Cells," Chem. Mater., 16, 4533-4542, 2004.

(Continued)

*Primary Examiner* — Anthony Ho
(74) *Attorney, Agent, or Firm* — Shumaker & Sieffert, P.A.

(57) ABSTRACT

A photovoltaic device is disclosed that includes a transparent front electrode formed by the self-assembly of conductive nanoparticles from an emulsion coated onto a substrate and dried. The nanoparticles self-assemble into a network-like pattern of conductive traces that define randomly-shaped transparent cells. The cells may be filled with various transparent filler materials and additional layers may be present in the device in addition to conventional components. Processes for forming the transparent electrode are also disclosed.

20 Claims, 15 Drawing Sheets

(56) References Cited

FOREIGN PATENT DOCUMENTS

| TW | 200705065 A | 7/1994 |
|---|---|---|
| WO | 03106573 A1 | 12/2003 |
| WO | 04000491 A2 | 12/2003 |
| WO | 2004052559 A2 | 6/2004 |
| WO | 2006135735 A2 | 12/2006 |
| WO | 2007022226 A2 | 2/2007 |
| WO | 2007043569 A1 | 4/2007 |

OTHER PUBLICATIONS

International Search Report and Written Opinion of international application No. PCT/US2008/013925, mailed Jul. 30, 2009, 19 pp.
International Preliminary Report on Patentability from international application No. PCT/US2008/013925, mailed Jul. 1, 2010, 12 pp.
Japanese Office Action from corresponding Japanese Application Serial No. 2010-539501 dated Oct. 20, 2012 in English (2 pages).
Japanese Office Action from corresponding Application Serial No. 2010-539501 dated Jan. 29, 2013 (2 pages).
Chinese Office Action from related Application Serial No. 200880126892.2 dated Oct. 25, 2011 including English translation (13 pages).
Office Action from Taiwan patent application No. 097149979, dated Apr. 10, 2013, 10 pp.
Office Action from corresponding Korean Application Serial No. 10-2010-7016046 dated Sep. 26, 2011 (including a translation) (9 pages).

PHOTOVOLTAIC DEVICE HAVING TRANSPARENT ELECTRODE FORMED WITH NANOPARTICLES

FIELD OF THE INVENTION

The present invention relates to a method for producing devices for converting light to electricity and devices produced thereby.

BACKGROUND OF THE INVENTION

The photovoltaic effect used in solar cells allows direct conversion of light energy from the sun's rays into electricity by way of the generation and transport inside a semiconductor material of positive and negative electrical charges. The action of light impinging on the semiconductor material creates positive and negative charges unbound, or weakly bound, to each other, that are capable of diffusing to or being otherwise captured by different electrodes in contact with the semiconductor.

Electrodes are placed on both sides of the semiconductor material to collect the electrical charge. Light must enter the solar cell through at least one of the electrodes, generally referred to as the "front" electrode. Thus, the front electrode must be transparent to light as well as be electrically conductive.

Transparent front electrodes typically consist of a silver wire grid pattern that is applied to the surface of the semiconductor material by screen printing or other form of contact printing. Alternatively, they may consistent of a more uniform/contiguous film of transparent conductive material, such as a film of indium tin oxide ("ITO").

ITO films suffer from a number of disadvantages including inferior transparency, particularly in the infrared and ultraviolet regions of the spectrum, and marginal conductivity. Both of these disadvantages result in lower efficiency of the solar cell. ITO is also expensive and concerns have been raised about dwindling global supplies of indium. ITO is also brittle and does not lend itself to roll-to-roll processing or use in flexible solar cells.

Silver wire grids also have significant drawbacks, especially in the fabrication of solar cells with silicon wafers. The application of the grid pattern to the silicon wafer by contact printing techniques can result in significant wafer breakage. Sensitivity to breakage requires manufacturers to use thicker silicon substrates than might otherwise be preferred, and the thickness of silicon substrates is a dominant factor in overall cell cost. Further, conventional screen printed Ag electrodes tend to have poor geometries, including poor aspect ratios for front electrode purposes, meaning they are relatively wide (casting a large shadow) and relatively short (meaning offering less overall electrical conductance than would be preferred). Further, they cannot be printed in close proximity to each other owing to resolution limits.

Thus a need exists for an improved transparent conductive front electrode for photovoltaic cells that eliminates the disadvantages of the transparent conductive front electrodes currently used.

SUMMARY OF THE INVENTION

The present inventions seeks to provide an improved method for producing devices for converting light to electricity and improved devices produced thereby.

The method and device include a transparent electrode comprising a pattern of conductive traces formed of at least partially joined nanoparticles defining randomly-shaped cells generally free of nanoparticles and generally transparent to light. The conductive traces self-assemble from a liquid emulsion containing the nanoparticles after the emulsion is coated onto a substrate and dried. The traces can be formed on the substrate by conventional liquid coating processes that do not require physical contact of the coating equipment with the substrates thereby reducing the possibility of breakage to the substrate. The electrode is flexible and can be made by cost-effective roll-to-roll coating processes.

In addition to the transparent electrode formed from nanoparticles, the photovoltaic devices include a semiconductor substrate in electrical contact with the transparent electrode, and a second electrode on the opposite side of the semiconductor substrate from the transparent electrode and having a different work function. The second electrode may be transparent or non-transparent. The second electrode may also comprise a pattern of conductive traces comprising at least partially joined nanoparticles defining randomly-shaped cells that are generally free of nanoparticles and transparent to light. Such photovoltaic devices are capable of generating power when illuminated from both sides.

In one embodiment the cells of the patterned electrode are filled with a light transmissive filler material that may serve a variety of functions. In another embodiment, the filler material extends beyond the height of the conductive traces.

The photovoltaic devices of the invention may contain additional layers, such as a layer over the filler material and traces to help carry charges out of the device or, for example, to provide anti-reflection properties, or a layer on the surface of the semiconductor substrate to help carry charges out of the device or prevent shorting between electrodes, or protective layers to provide isolation or protection from environmental factors.

In another embodiment, tandem devices are formed by including an additional semiconductor substrate over the patterned electrode and an additional patterned electrode having a different work function over the additional semiconductor substrate.

One method of making a photovoltaic device according to the invention comprises the steps of (1) providing a substrate having a semiconductor surface; (2) forming a first electrode layer over the semiconductor surface in a manner that provides a pattern of conductive traces formed of at least partially joined nanoparticles defining randomly-shaped cells that are generally free of nanoparticles and transparent to light; and (3) providing a second electrode layer adjacent the surface of the semiconductor substrate opposite to the surface on which the first electrode is formed.

In a preferred embodiment of the invention, the patterned electrode is formed from an emulsion containing nanoparticles that is coated onto the semiconductor substrate, and during the evaporation of the liquid in the emulsion, the nanoparticles self-assemble into the conductive pattern. Other embodiments of the method include (1) coating the nanoparticle emulsion on both sides of the semiconductor substrate; (2) coating the nanoparticle emulsion onto the semiconductor substrate in a continuous, roll-to-roll process; (3) coating the nanoparticle emulsion on a pre-patterned substrate; (4) forming the patterned electrode on a substrate and subsequently combining it with the semiconductor assembly, and in some cases removing the patterned electrode from the substrate before combining it with the semiconductor assembly; and (4) deformation of the patterned electrode during the process of transferring it from a carrier substrate to the semiconductor assembly.

The transparent electrode used in the photovoltaic devices of the present invention provides higher or similar transparency than ITO in the visible range of the spectrum and higher transparency in the infrared and ultraviolet ranges. Higher transparency can lead to higher light power conversion efficiency.

The transparent electrode used in the photovoltaic devices of the present invention also has lower resistivity than ITO. Lower resistivity can lead to lower ohmic power losses in conversion of optical power to electrical power.

Further, the geometry of the network pattern of the transparent electrode is advantageous over the geometry of conventional screen-printed silver grids by providing greater transparency. The line width of screen-printed grids is typically quite large (100 microns) in comparison to the line width of the traces forming the network of the transparent electrodes of the present devices (~10 microns). Reduced line widths allow greater transparency. The height of conventionally printed or ink jet printed lines is also low relative to its width, giving it a poor aspect ratio for maximum transparency. Thus, for a given amount of metal (conductance), there is a greater amount of shadowing present (loss in optically convertible power) in a wide but short wire than would be available in a narrow but relatively tall wire. Aspect ratios of conventional electrodes may be on the order of 1:10 (height to width). Aspect ratios of the transparent electrodes used in the devices of the present invention are typically much better, i.e., 1:5 or higher and preferably 1:2 or higher. Higher aspect ratios allow for better combination of transparency with conductance and thus better overall power conversion efficiency.

Further, conventional screen-printed silver electrodes tend to have poor geometries for conductance purposes owing not only to their poor aspect ratios but also to the fact that the lines of the grid pattern cannot be printed in close proximity to each other owing to resolution limits. In the case of more distantly spaced grid lines, photogenerated charge carriers need to travel longer distances through higher resistivity regions (and with greater change of carrier recombination) leading to greater power loss. Relatedly, conventional solar cells often make use of dopant agents within the printed silver grid pattern intended for diffusion into the underlying semiconductor substrate. However, this diffusion is limited in geometry to areas defined by the limited geometries capable of screen printing. The narrower lines and smaller cells of the electrodes described herein allow more efficient dopant placement within the semiconductor substrate. Also, in the case of crystalline silicon photovoltaic devices, a more closely spaced electrode assembly as is possible with the electrode used in the present invention would allow the use of a more lightly-doped front n-layer, which is generally thought to be beneficial for the device internal quantum efficiency (IQE), especially in the blue and UV part of the spectrum Printed silver wire grids also have significant drawbacks, especially in the fabrication of solar cells with silicon wafers. The application of the grid pattern to the silicon wafer by contact printing techniques can result in significant wafer breakage. Sensitivity to breakage requires manufacturers to use thicker silicon substrates than might otherwise be preferred, and the thickness of silicon substrates is a dominant factor in overall cell cost.

Other advantages of the transparent electrodes and the photovoltaic devices made with the electrodes will be apparent from the detailed description.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
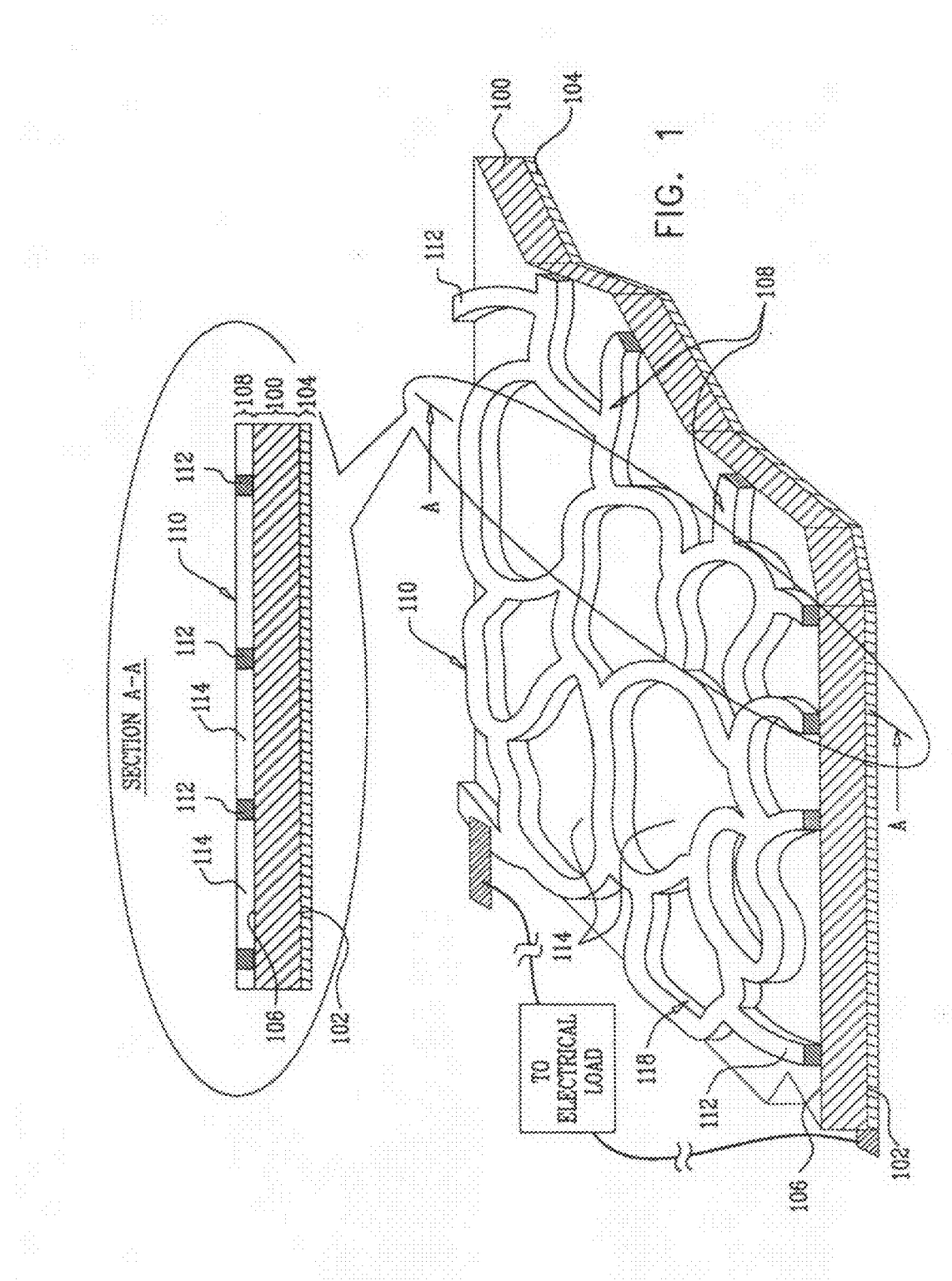
FIG. 1 is a simplified illustration of a device for converting light to electricity in accordance with one embodiment of the invention.

Reference is now made to FIG. 1, which is a simplified illustration of a device for converting light to electricity in accordance with a one embodiment of the present invention.

As seen in FIG. 1, the device for converting light to electricity comprises a semiconductor substrate 100 having formed on an underside surface 102 thereof and in effective electrical contact therewith, an electrode 104.

The semiconductor substrate 100 may be any suitable semiconductor substrate, for example, materials known in the art as inorganic semiconductors, including but not limited to, silicon, geranium, compounds of boron, tellurium, gallium, or tin, and compounds such as gallium arsenide (GaAs), gallium phosphide (GaP), indium phosphide (InP), cadmium telluride (CdTe), cadmium sulphide (CdS), gallium aluminum arsenide (GaAlAs), mercury cadmium telluride (HgCdTe), gallium arsenide phosphide (GaAsP), copper indium gallium diselenide (CIGS), and copper indium selenide or sulfide.

The materials may be doped or undoped, and they may be in any suitable form known in the art such as amorphous, polycrystalline, microcrystalline, or single crystals, including wafers. The semiconductor layer 100 may include p-n, p-i-n, n-p-n, or p-n-p junctions or other configurations known in the art, such as those employed in Schottky-junction photovoltaic devices.

The semiconductor substrate 100 can have a thickness of up to approximately 1000 microns. For example, substrate 100 may be a thick film semiconductor such as a conventional 100-500 micron thick silicon wafer or a thin film having a thickness on the order of less than 100 microns. Thin film inorganic semiconductors can be produced at thicknesses on the order of 1-2 microns.

Additionally, hetero junctions comprising chemically-distinct semiconductors (such as in organic photovoltaic cells with p-type and n-type layers) may be provided in different layers or intermixed with each other. Ambipolar materials may also be employed.

Alternatively or additionally, materials known in the art as "excitonic" semiconductors may be employed in the semiconductor substrate 100. Photoconversion in excitonic photovoltaic devices is fundamentally different than in conventional inorganic photovoltaic devices. Excitons are often described as being a bound electron-hole pair, as opposed to a free electron-hole pair. Excitons are generated upon light absorption and the charge carriers are simultaneously separated across a heterointerface, or are generated within a few nanometers of the interface to which they diffuse. An internal electric field is not necessarily required for charge separation. Bulk recombination, which is the major recombination process in conventional photovoltaic devices, can usually be neglected in excitonic solar cells because the bulk density of minority carriers therein is insignificant, however the lifetime of the excitons are quite short.

Alternatively or additionally, the semiconductor substrate 100 may be of the type employed in dye-sensitized solar cells (DSSC's). Currently DSSC's be produced in thicknesses of 10 microns or less, whereas thin film polymer and bulk heterojunction semiconductor layers can be constructed with thicknesses of 100-200 nm or less.

Alternatively or additionally, the semiconductor substrate may include organic semiconductors, such as polymer or small molecule organics with conjugated structures or linear fused ring compounds. For example, organic semiconductors known in the art include polyphenylvinylene, polyacetylene, thiophenes, perylenes, pentacene, anthracene, tetracene, rubrene, naphthalene, and derivatives. These materials may be doped or undoped. Organic semiconductors can include amorphous or semicrystalline compounds or polymers, and be of any appropriate molecular weight and packing, and can include self-assembling copolymers. They may be functionalized to aid solubility, surface tension, assembly or other improvements. The semiconductor substrate 100 may include at least one heterojunction between different layers or domains.

The semiconducting materials, whether organic or inorganic or a combination of both such as in hybrid devices, can be comprised of mixtures or other combinations, or various layers of the above-mentioned materials. They may further include light absorbing or light emitting entities such as quantum dots or light sensitive dyes or pigments, as in dye-sensitized titanium dioxide semiconductors, or phthalocyanine derivates. Fullerenes and related compounds such as graphene or carbon nanotubes may be incorporated into the semiconductor substrate 100.

Electrode 104 typically has a thickness of 50 nm to about 2 microns, and may even be thicker. It may be a conventional electrode or a transparent electrode. If it is transparent, electrode 104 may be produced from transparent conductive coatings and patterns such as the transparent electrode described herein or from an alternative light-transmitting conductive material known in the art, such as conductive thin film oxides, especially ITO or zinc oxide, from carbon nanotube or fullerene or graphene networks, or printed bus bars, or from conductive polymers such as PEDOT or PEDOT:PSS, which are poly(3,4-ethylenedioxythiophene), and poly(3,4-ethylenedioxythiophene)-poly(styrenesulfonate), respectively. Electrode 104 may also be manufactured from mixtures or other combinations or various layers of conductive materials such as, but not limited to, the above light-transmitting conductive materials. Examples of an electrode suitable for use as electrode 104 are described in U.S. Pat. No. 6,951,770, which is hereby incorporated by reference. Such electrodes are preferably formed of aluminum or, silver, or a combination of layers of both and can be formed by various techniques such as spray coating, screen-printing, electro-deposition, metal evaporation, vapor deposition, sputtering or other printing or coating processes.

Electrode 104 may or may not be apertured. Electrode 104 typically includes a full layer of contact metal formed for example, by spray coating or screen-printing a metal paste, such as aluminum or another conductive metal or combinations thereof, such as an Al/Ag grid.

Electrode 104 is preferably reflective so that light impinging thereon through the semiconductor substrate 100 is reflected by electrode 104 back into the semiconductor substrate 100, resulting in increased light absorption at the semiconductor substrate 100.

Electrode 104 may contain doping materials that will dope the semi conductor layer forming an n or p thin layer in the semiconductor 100 layer. The doping will usually occur during the heat treatment process in the production process of the device. An example of doping material is aluminum.

Over a surface 106 of semiconductor substrate 100 an electrode layer 108 is formed comprising a pattern 110 of conductive traces 112 formed of collections of at least partially joined nanoparticles defining cells 114, generally free of the partially joined nanoparticles, and generally transparent to light.

As will be described hereinbelow in greater detail with reference to FIGS. 9-14, a coating of an emulsion is employed to form the light-transmitting electrode layer 108. Drying of the emulsion produces pattern 110 which defines distinct light-transmitting cells 114 surrounded by traces 112 that transmit significantly less light than the light-transmitting cells 114. The light-transmitting cells 114 and the peripheral traces 112 have a network-like character which is observable by light microscopy. The traces 112 are preferably formed by evaporation of a liquid phase of the emulsion.

In a preferred embodiment, the pattern 110 is formed after deposition of a water-in-oil emulsion, where the emulsion contains a water or water-miscible phase, an organic solvent phase, and nanoparticles having conductive properties when they are partially joined.

The nanoparticles preferably are comprised of conductive metals or mixture of metals including metal alloys selected from, but not limited to, the group of silver, gold, platinum, palladium, nickel, cobalt, copper or any combination thereof. Suitable nano metal particles include silver, silver-copper alloys, silver palladium or other silver alloys or metals or metals alloys produced by a process known as Metallurgic Chemical Process (MCP), described in U.S. Pat. No. 5,476, 535 ("Method of Producing High Purity Ultra-Fine Metal Powder") and PCT application WO 2004/000491 A2 ("A Method for the Production of Highly Pure Metallic Nano-Powders and Nano-Powders Produced Thereby"). The nanoparticles may be coated or non-coated and may be agglomerated or non-agglomerated.

Conductive nanoparticles may also be comprised of metal oxides, metal salts, conductive polymers, carbon derivatives such as carbon black, graphite, fullerenes, or other carbon allotropes. Precursors or combinations of the above particles may also be employed.

Emulsions of the type described hereinabove and use thereof to produce conductive traces 112 are described in applicant/assignee's patent publications US20050215689 and WO2006135735, the disclosure of which is hereby incorporated by reference. The resulting pattern 110 and the shapes of cells 114 is random in nature. Typically, the width of the traces 112 is less than 40 microns, the height is less than 20 microns and average cell diameter is less than 1000 microns, and in some cases much smaller, for example on the order of 5 microns. The ratio of the average cell size to the thickness of the semiconductor substrate can be an important design feature in photovoltaic cells.

Semiconductor layer thicknesses are preferably small owing to materials and processing cost, but are limited in how small they can be by optical absorption requirements (particularly in thin film cells) as well as by mechanical strength (particularly in crystalline silicon cells). Network cell sizes can affect cell performance due to their effect on shadowing and conductance, and thus should be tailored accordingly.

Small network cell size is preferred/necessary for low ohmic resistance losses in photovoltaic devices utilizing highly resistive materials (e.g. amorphous silicon or organic cells). In such devices, having a network cell size that is on the order of the thickness of the semiconductor layer engenders a resistance associated with lateral motion of charge carriers from the middle of the cell that is generally no larger than the resistance associated with vertical motion of the carriers within the semiconductor layer, i.e., the path length for moving carriers for a small network cell is no longer horizontally than vertically. Larger network cell diameters could generate substantially greater ohmic losses, and are thus generally not preferred.

Photovoltaic devices using low resistive material such as crystalline silicon wafers can have larger network cell size. For example, the ratio of the average cell diameter to the thickness of the semiconductor layer in such devices can be in the range of 1:3 to 1:1, preferably 1:2.

It is appreciated that electrode layer 108 and electrode 104 typically have work functions that differ from each other.

The pattern 110 of conductive traces 112 has a sheet resistance after sintering between 0.005 $\Omega$/square to 5 k$\Omega$/square, preferably less than 50 ohm/sq, more preferably less than 20 ohm/sq, and most preferably less than or equal to 10 ohm/sq. Sheet resistance may further be reduced by subsequent electroplating of the deposited pattern. It is appreciated that conductive traces 112 may obviate the need for conductive bus bars and fingers as used in conventional photovoltaic devices.

In various designs, including dye-sensitized solar cells (DSSCs), plating can be used to make an additional layer over silver conductive traces. In some applications (e.g. DSSCs), the use of such a protective layer over the silver may be useful.

Electrode layer 108 is particularly useful in devices that require transmission of visible, NIR, IR, and/or UV regions of the electromagnetic spectrum. The term "light transmitting" is used herein interchangeably with the term "transparent" and refers to light transmission of at least 30%, and preferably at least 50%, and more preferably at least 70%. For applications requiring transmission of visible light, transmission is measured in the wavelength range of 400 nm to 700 nm, and more specifically can be measured at 550 nm.

The transparency of electrode layer 108 is preferably relatively uniform at approximately 90% from UV through near IR wavelengths. In contrast, a typical ITO layer as would be used in a conventional thin film solar cell may have transparency in the visible range of approximately 90%, but in the near UV range, the transparency may rapidly drop with decreasing wavelength from 80% at 400 nm down to <10% at 200 nm (Biyikli et al., IEEE Journal of Selected Topics in Quantum Electronics, Vol 10, No. 4, 2004, 759). Similarly, in the IR range, ITO may have transparency that drops from 75% to 90% at 800 nm down to 47% to 88% at 1100 nm (depending on ITO thickness). See http://www.pgo-online.com/intl/katalog/itotrans.html.

In accordance with a preferred embodiment of the present invention the percentage of the overall surface 106 of the semiconductor substrate that does not receive incoming light due to shading by traces 112 is preferably not higher than 15%. Furthermore, the traces 112 may provide texture and anti-reflective characteristics.

Additional nanoparticles may be present in the traces 112 for the purpose of adding specific functionality or enhancing the properties of traces 112 such as adhesion, doping, gas barrier, scratch resistance, contact and sheet resistance or preferential diffusion into an adjacent layer. For example, glass frits or sub-micron glass beads or silica may be added to the emulsion formulation and be present in the traces 112 so as to aid inter-diffusion and adhesion with a silicon-based semiconductor layer. Additionally or alternatively, dopants, quantum dots, fluorescent materials and other additives such as metal precursors or polymer precursors may be included in the emulsion so as to be present in traces 112 following emulsion deposition and solvent evaporation. For example, doping particles within the traces may partially diffuse into an adjacent layer, such as a semiconductor substrate. These functionalities may be enhanced in various ways, such as by heating to enhance diffusion of doping particles into an adjacent layer. Aluminum is an example of a suitable dopant.

Materials that are soluble in the organic phase of the emulsion can be incorporated into traces 112 upon drying of the emulsion, e.g., a glass precursor to enhance contact resistance. Also, materials that have an affinity for the interface between water and oil phases of the emulsion can be incorporated into traces 112 upon drying of the emulsion. Materials that are soluble in the water phase of the emulsion such a pigments will be deposited in cells 114.

The device shown in FIG. 1 may stand alone or may be formed on or placed on a flexible or rigid substrate such as glass, paper, ceramic or fabric. Such substrate may include a polymer such as a polyester, polyamide, polyimide, polycarbonate, polyolefin, polyacrylate, polymethyl methacrylate (PMMA), cyclic olefin polymers, a copolymer, or mixtures thereof. The device may be formed with a flat surface or a curved surface. The semiconductor substrate can have a rough surface and/or a non-flat surface.

Figure 2:
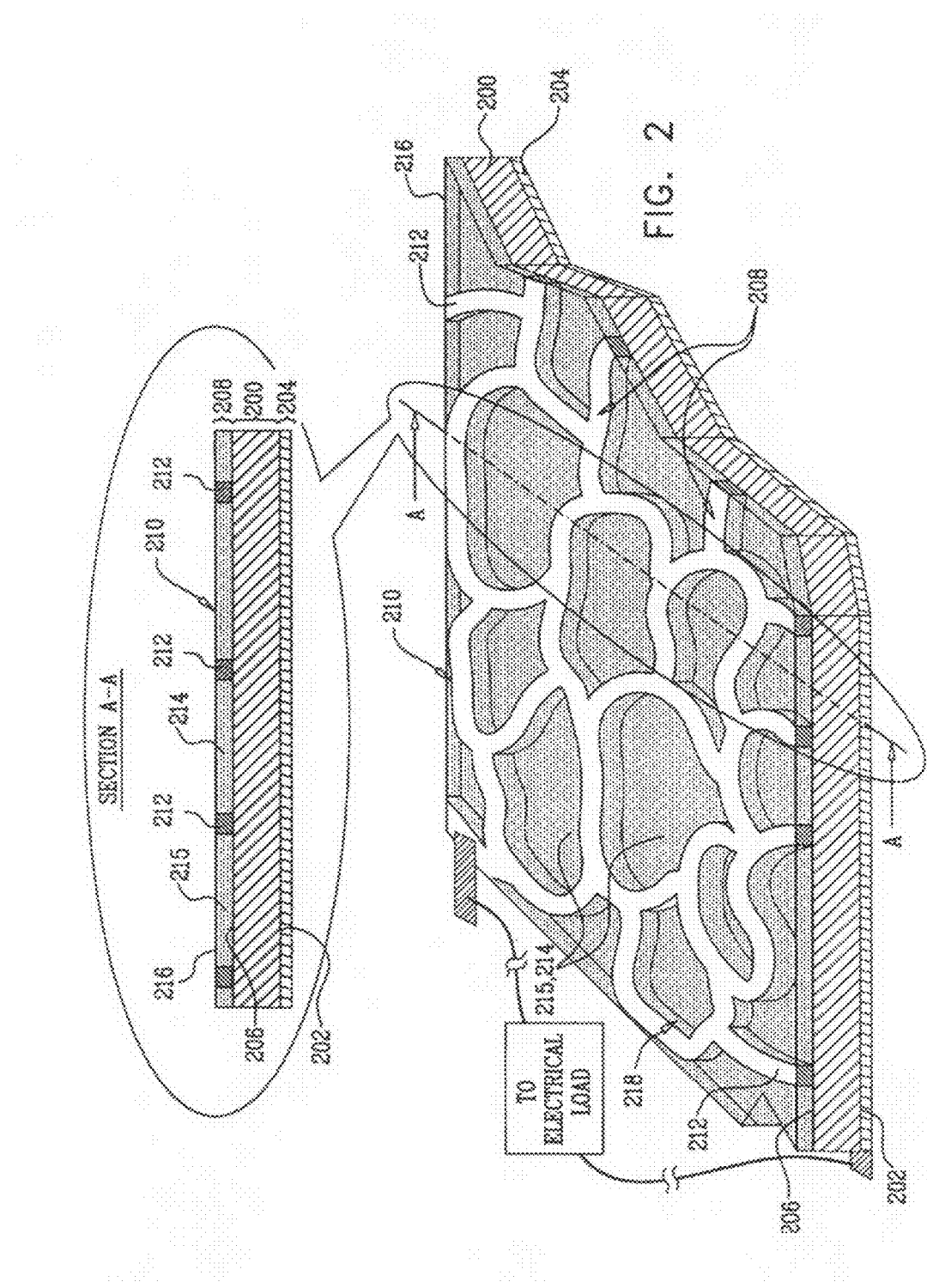
FIG. 2 is a simplified illustration of a device for converting light to electricity in accordance with another embodiment of the invention wherein the cells of the patterned electrode are filled with a filler material.

Reference is now made to FIG. 2, which is a simplified illustration of a device for converting light to electricity in accordance with another embodiment of the invention.

As seen in FIG. 2, the device for converting light to electricity comprises a semiconductor substrate 200 having formed on an underside surface 202 thereof and in effective electrical contact therewith, an electrode 204. Over a surface 206 of semiconductor substrate 200 is an electrode layer 208 comprising a pattern 210 of conductive traces 212 formed of at least partially joined nanoparticles defining randomly-shapes cells 214, generally free of the partially joined nanoparticles and transparent to light. Semiconductor substrate 200, electrode 204, and electrode layer 208 correspond to semiconductor substrate 100, electrode 104 and electrode layer 108 of FIG. 1 and are as described with respect to FIG. 1.

As is described above in connection with electrode layer 108 of FIG. 1, electrode layer 208 is preferably formed from a coated emulsion containing conductive nanoparticles. The light transmitting cells 214 and the surrounding traces 212 have a network-like character and are observable with light microscopy.

In the embodiment of FIG. 2, cells 214 of electrode layer 208 are filled with a light-transmissive filler 215. Suitable filler materials may include quantum dots, nonconductive polymers, semiconductor materials, silica, pigments, dyes, chromic shift additives, metal oxides and/or their precursors, conductive polymers and/or their precursors. Filler 215 can also comprise particles that change the spectrum of the transmitted light, i.e., emitting light with a more compatible spectrum to the active photovoltaic layer in the device, thereby increasing efficiency of the device.

Filler 215 may provide mechanical protection, especially anti-abrasion or anti-scratch protection, as well as protection against moisture, oxygen or ultra-violet radiation or other constituents in the environment.

Filler 215 may be employed to create a smooth overall surface 216 at the height of the traces 212. For example, conductive or non-conductive transparent material such as a polymer, for example, PEDOT:PSS, a transparent and conductive polymer, may be applied to fill in the open areas 214 and to help carry charges out of the device. Filler 215 may also be a "glue" or a pressure sensitive adhesive (PSA) that will adhere or laminate an additional layer (polymer, substrate, etc.) on top of the photovoltaic device. It also can be a "hard coating" or "anti glare" coating or other coating similar to those used in display films. It can be also an antistatic material or anti-smudge material. Also materials that selectively absorb and emit light or combinations of the foregoing can be used.

Filler 215 can have an anti-reflecting function. Anti-reflective materials may be incorporated therein, such as addition of glass frits or glass spheres, silicon nitride, silicon monoxide or dioxide, titanium dioxide or zinc oxide. Texturing of the surface 216 or altering the refractive index of the material at surface 216 may also provide anti-reflective properties. As an example, antireflection coatings of $TiO_2$ may be in a layer several hundred nanometers thick using simple techniques like spraying or chemical vapor deposition.

As is the case with the device of FIG. 1, the device shown in FIG. 2 may stand alone or may be formed on or placed on a flexible or rigid substrate as described in connection with FIG. 1.

Figure 3:
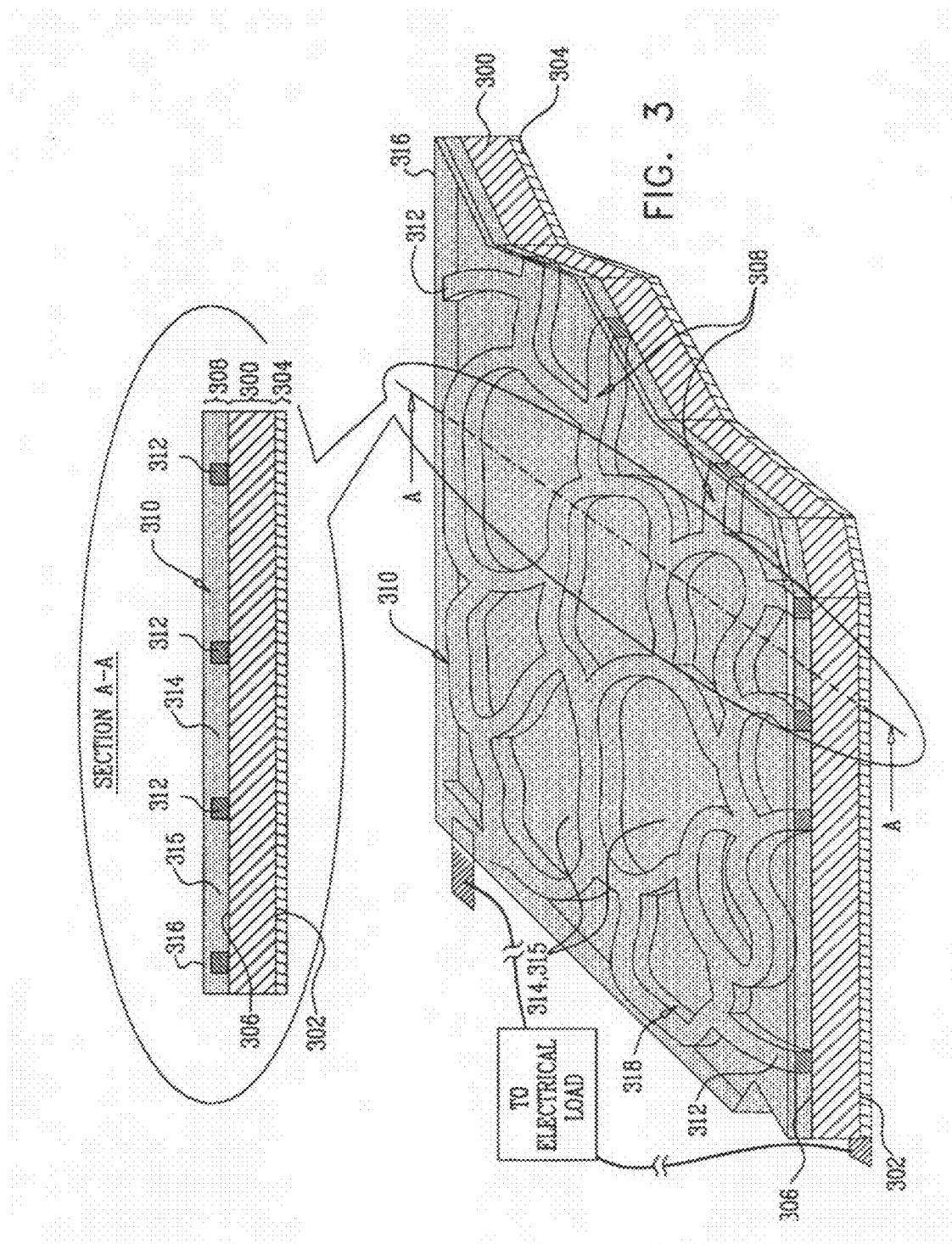
FIG. 3 is a simplified illustration of a device for converting light to electricity in accordance with another embodiment of the invention wherein the filler material in the cells extends over the traces of the patterned electrode.

Reference is now made to FIG. 3, which is a simplified illustration of a device for converting light to electricity in accordance with another embodiment of the invention.

As seen in FIG. 3, the device for converting light to electricity comprises a semiconductor substrate 300 having formed on an underside surface 302 thereof and in effective electrical contact therewith, an electrode 304. Over a surface 306 of semiconductor substrate 300 an electrode layer 308 is formed comprising a pattern 310 of conductive traces 312 formed of at least partially joined nanoparticles defining randomly-shaped cells 314, generally free of the partially joined nanoparticles and transparent to light, which cells contain filler 315.

As is described above in connection with electrode layer 108 of FIG. 1, electrode layer 308 is preferably formed from a coated emulsion containing conductive nanoparticles. The light transmitting cells 314 and the surrounding traces 312 have a network-like character and are observable with light microscopy.

Semiconductor substrate 300, electrode 304, electrode layer 308, and filler 315 correspond to semiconductor substrate 200, electrode 204, electrode layer 208 and filler 215 of FIG. 2 and are as described with respect to FIG. 2. However, it is a particular feature of the embodiment of FIG. 3 that filler 315 extends over pattern 310 of conductive traces 312. Filler 315 may create a smooth overall surface 316 which lies above the height of the traces 312.

As is the case with the devices of FIGS. 1 and 2, the device shown in FIG. 3 may stand alone or may be formed on or placed on a flexible or rigid substrate as described in connection with FIG. 1.

Figure 4:
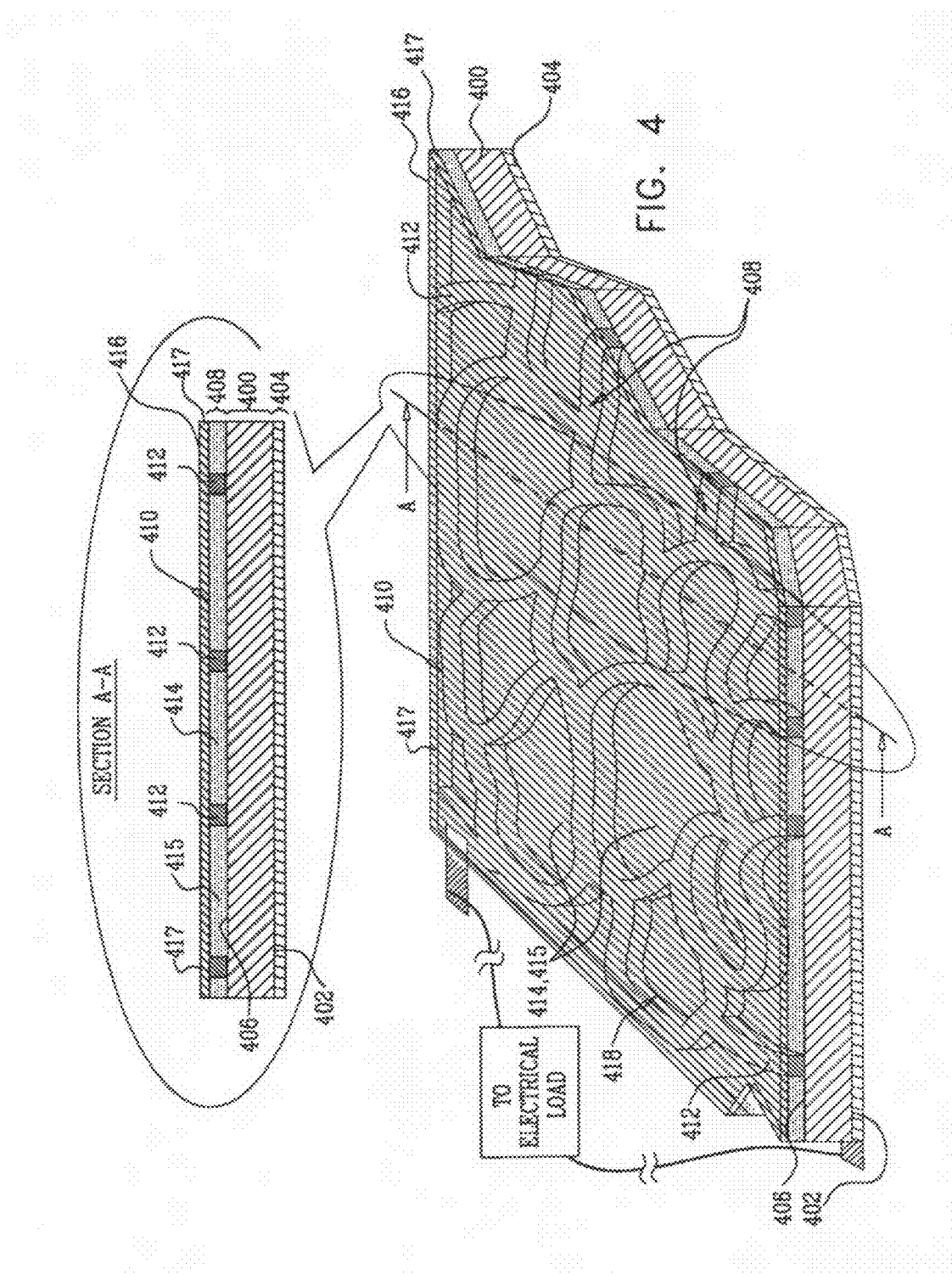
FIG. 4 is a simplified illustration of a device for converting light to electricity in accordance with another embodiment of the invention wherein the cells of the patterned electrode are filled with a filler material and an additional layer is provided over the filler and the traces.

Reference is now made to FIG. 4, which is a simplified illustration of a device for converting light to electricity in accordance with another embodiment of the invention.

As seen in FIG. 4, the device for converting light to electricity comprises a semiconductor substrate 400 having formed on an underside surface 402 thereof and in effective electrical contact therewith, an electrode 404. Over a surface 406 of semiconductor substrate 400 an electrode layer 408 comprising a pattern 410 of conductive traces 412 formed of at least partially joined nanoparticles defining randomly-shaped cells 414, generally free of the partially joined nanoparticles and transparent to light and containing filler 415. Semiconductor substrate 400, electrode 404, electrode layer 408, and filler 415 correspond to semiconductor substrate 200, electrode 204, electrode layer 208 and filler 215 of FIG. 2 and are as described with respect to FIG. 2.

As is described above in connection with electrode layer 108 of FIG. 1, electrode layer 408 is preferably formed from a coated emulsion containing conductive nanoparticles. The light transmitting cells 414 and the surrounding traces 412 have a network-like character and are observable with light microscopy.

It is a particular feature of the embodiment of FIG. 4 that there is an additional layer 417 of material provided over filler 415 and over pattern 410 of conductive traces 412. The composition of the additional layer 417 may include quantum dots, nonconductive polymers, semiconductor materials, silica, pigments, dyes, light modifiers, metal oxides and/or their precursors, conductive polymers and/or their precursors, and differs at least partially from filler 415. Layer 417 preferably has a smooth overall surface 416 which lies above the height of the traces 412. For example, conductive or non-conductive transparent material such as a polymer, for example, PEDOT:PSS, a transparent and conductive polymer, may be employed in layer 417 to help carry charges out of the device. Layer 417 may be an additional transparent conductive layer.

The material of layer 417 can have an anti-reflecting function. Anti-reflective materials may be incorporated therein, such as addition of glass spheres, silicon nitride, silicon monoxide or dioxide, titanium dioxide or zinc oxide. Texturing of the surface 416 or altering the refractive index of the material at surface 416 may also provide anti-reflective properties. As an example, antireflection coatings of $TiO_2$ may be in a layer several hundred nanometers thick using simple techniques like spraying or chemical vapor deposition.

As is the case with the devices of FIGS. 1-3, the device shown in FIG. 4 may stand alone or may be formed on or placed on a flexible or rigid substrate as described in connection with FIG. 1.

Figure 5:
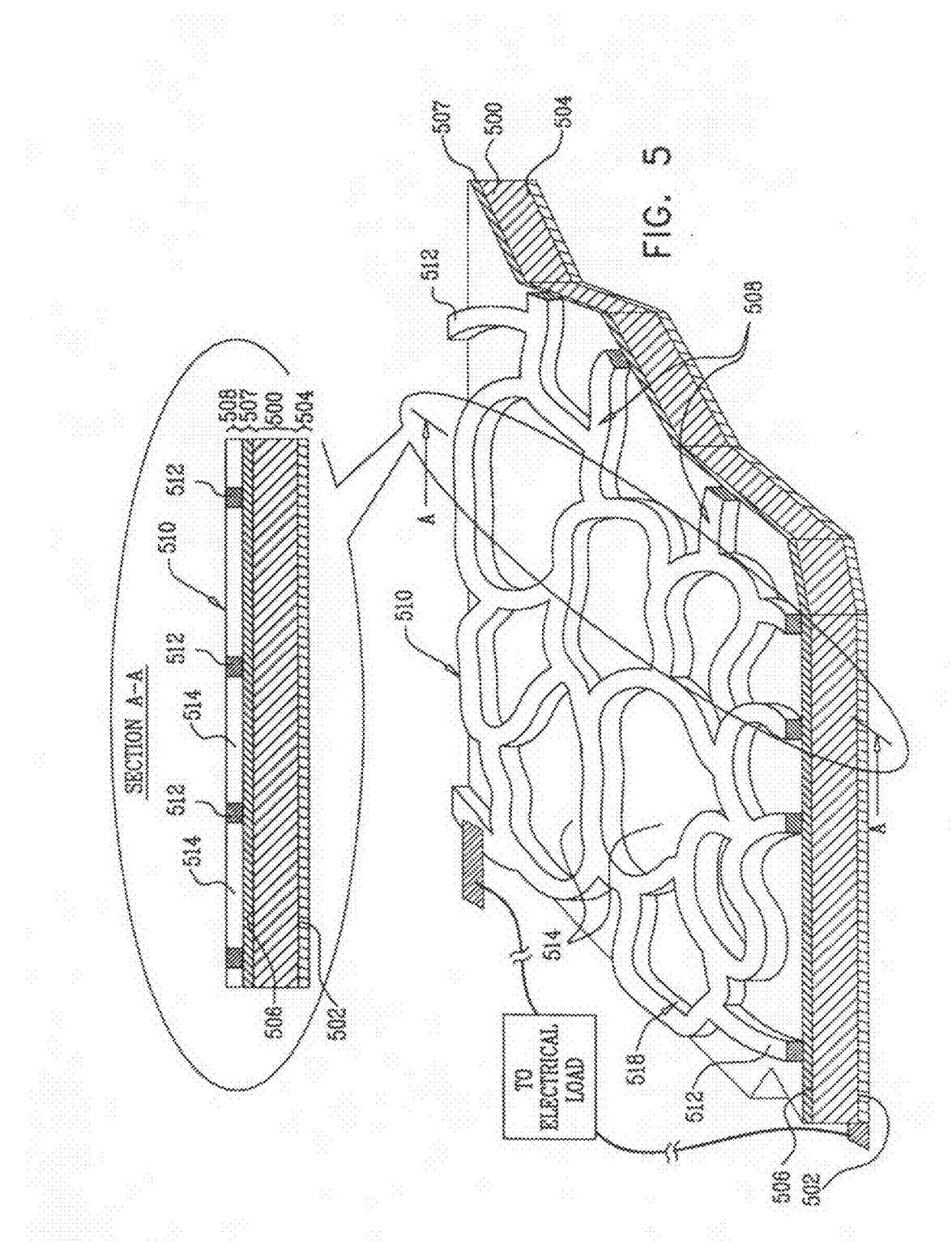
FIG. 5 is a simplified illustration of a device for converting light to electricity in accordance with another embodiment of the invention wherein an additional layer is provided between the semiconductor substrate and the patterned electrode.

Reference is now made to FIG. 5, which is a simplified illustration of a device for converting light to electricity in accordance with another embodiment of the invention.

As seen in FIG. 5, the device for converting light to electricity comprises a semiconductor substrate 500 having formed on an underside surface 502 thereof and in effective electrical contact therewith, an electrode 504. Over a surface 506 of semiconductor substrate 500 an electrode layer 508 comprising a pattern 510 of conductive traces 512 formed of at least partially joined nanoparticles defining randomly-shaped cells 514, generally free of the partially joined nanoparticles and transparent to light. Semiconductor substrate 500, electrode 504, and electrode layer 508 correspond to semiconductor substrate 100, electrode 104 and electrode layer 108 of FIG. 1 and are as described with respect to FIG. 1.

As is described above in connection with electrode layer 108 of FIG. 1, electrode layer 508 is preferably formed from a coated emulsion containing conductive nanoparticles. The light transmitting cells 514 and the surrounding traces 512 have a network-like character and are observable with light microscopy.

In accordance with the embodiment of FIG. 5, there is formed over the surface 506 of semiconductor substrate 500 an additional layer 507 of a material, preferably, but not necessarily, a conducting or semiconducting polymer.

For example, a layer 507 of PEDOT:PSS or related polymer can be provided over the semiconductor surface 506. PEDOT:PSS is transparent and conductive and may help carry charges out of the device. PEDOT:PSS can be applied by spin-casting.

Glass frits or sub-micron glass beads or silica may be included in layer 507 to enhance inter-diffusion and adhesion of layer 507 to the semiconductor surface 506.

Shorting between electrode layers 504 and 508 may also be reduced or prevented by a layer 507 of PEDOT:PSS. Glass beads or silicon nanoparticles or other particles may be incorporated into layer 507 in order to allow for good interfacial contact between electrode layer 508 and the semiconductor surface 506. They also can be incorporated into the emulsion that forms electrode layer 508.

Layer 507 may include a primer material to aid adhesion and allow for good coating properties of electrode layer 508.

In the case where semiconductor substrate 500 is a material such as crystalline silicon, Layer 507 may also be a material such silicon nitride that provides electrical passivation of the semiconductor surface as well as anti-reflective properties.

As is the case with the devices of FIGS. 1-5, the device shown in FIG. 5 may stand alone or may be formed on or placed on a flexible or rigid substrate as described in connection with FIG. 1.

Figure 6:
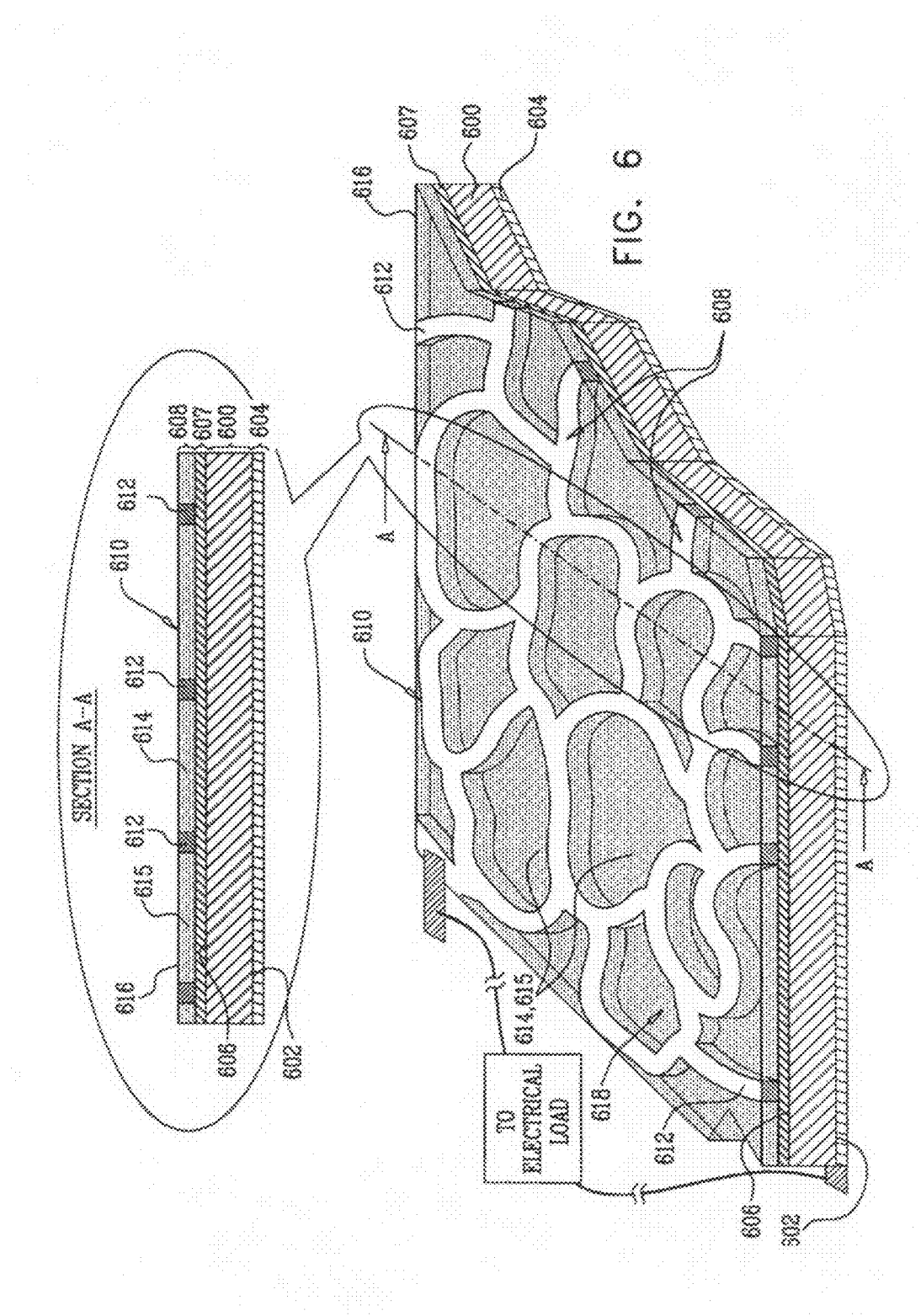
FIG. 6 is a simplified illustration of a device for converting light to electricity in accordance with another embodiment of the invention similar to the embodiment of FIG. 2 but having an additional layer between the semiconductor substrate and the patterned electrode.

Reference is now made to FIG. 6, which is a simplified illustration of a device for converting light to electricity in accordance with another embodiment of the invention.

As seen in FIG. 6, the device for converting light to electricity comprises a semiconductor substrate 600 having formed on an underside surface 602 thereof and in effective electrical contact therewith, an electrode 604. Over a surface 606 of semiconductor substrate 600 an electrode layer 608 if formed comprising a pattern 610 of conductive traces 612 formed of at least partially joined nanoparticles defining randomly-shaped cells 614, generally free of the partially joined nanoparticles and transparent to light and containing filler 615. Semiconductor substrate 600, electrode 604, electrode layer 608, and filler 615 correspond to semiconductor substrate 200, electrode 204, electrode layer 208 and filler 215 of FIG. 2 and are as described with respect to FIG. 2.

As is described above in connection with electrode layer 108 of FIG. 1, electrode layer 608 is preferably formed from a coated emulsion containing conductive nanoparticles. The light transmitting cells 614 and the surrounding traces 612 have a network-like character and are observable with light microscopy.

In accordance with this embodiment of the invention, there is formed over semiconductor substrate 600 an additional layer 607. Layer 607 corresponds to layer 507 of FIG. 5 and is as described in connection with FIG. 5.

As is the case with the devices of FIGS. 1-5, the device shown in FIG. 6 may stand alone or may be formed on or placed on a flexible or rigid substrate as described in connection with FIG. 1.

Note that the concepts used in making a transparent electrode on a single side of a photovoltaic cell herein may be used in making a pair of transparent electrodes on opposite faces of a photovoltaic cell very similarly. Such a cell may have advantages of being capable of generating light when illuminated from either side (so called bifacial cell), or, with appropriate design, being partially transparent to light so as to perhaps allow simultaneous use as a window as well as a power generator. Similarly, more complex geometries as shown in FIGS. 7 and 8, including three electrodes are a possibility, and are described below.

Figure 7:
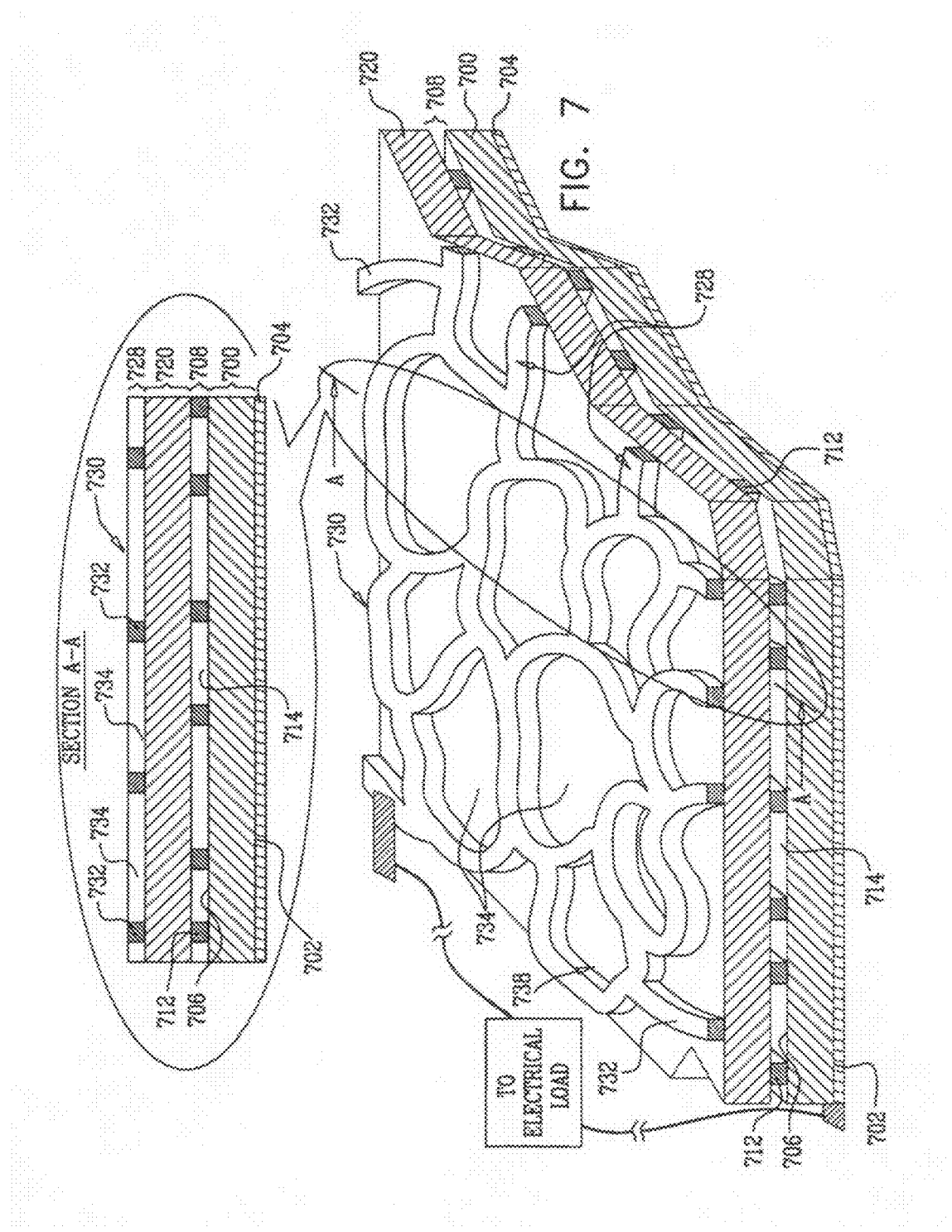
FIG. 7 is a simplified illustration of a device for converting light to electricity in accordance with another embodiment of the invention in which an additional semiconductor layer and patterned electrode are present.
Figure 8:
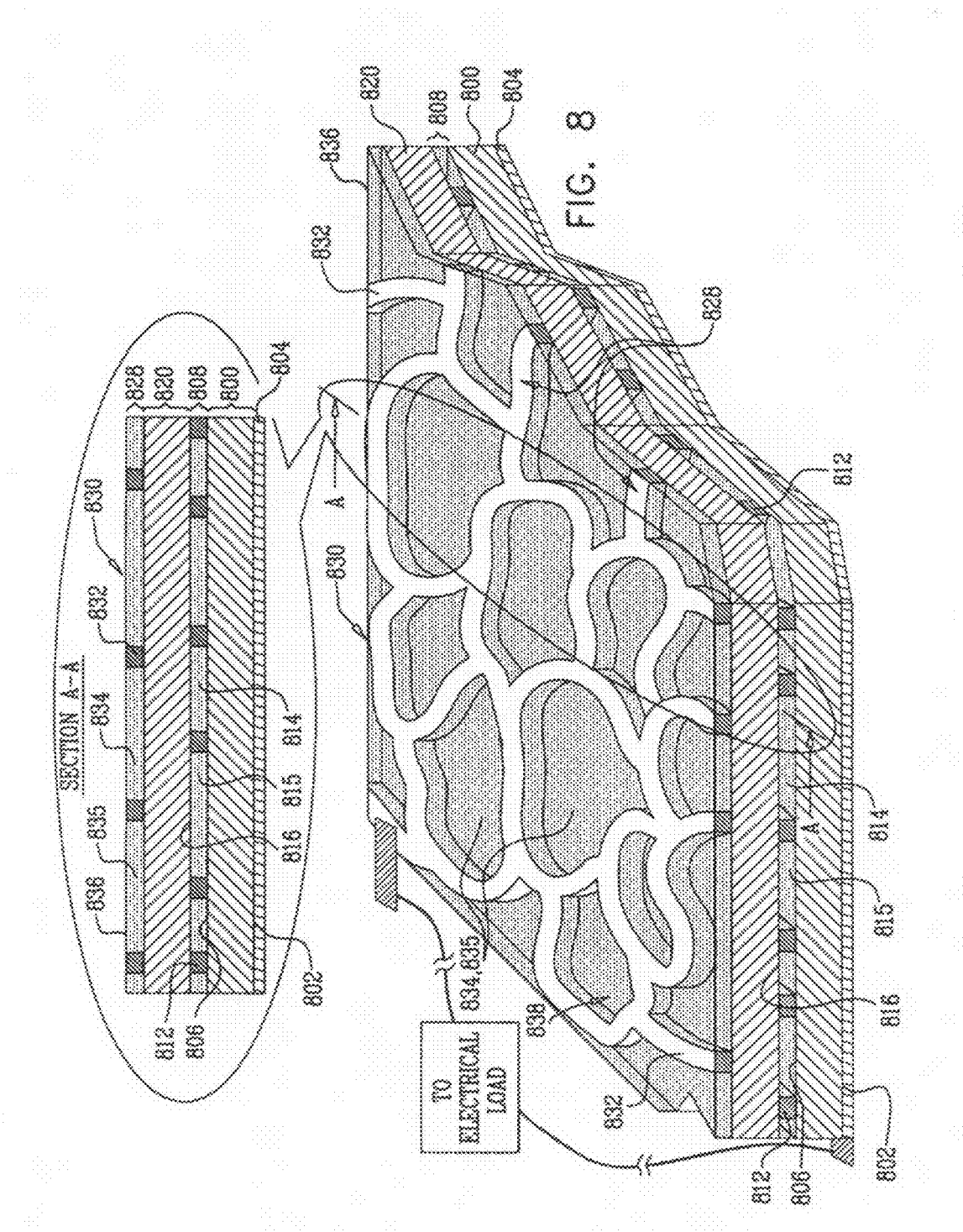
FIG. 8 is a simplified illustration of a device for converting light to electricity in accordance with another embodiment of the invention similar to the embodiment of FIG. 7 in which the cells of the patterned electrodes are filled with a filler material.

Reference is now made to FIG. 7, which is a simplified illustration of a device for converting light to electricity in accordance with another embodiment of the invention.

As seen in FIG. 7, the device for converting light to electricity preferably comprises a semiconductor substrate 700 having formed on an underside surface 702 thereof and in effective electrical contact therewith, an electrode 704. Over the surface 706 of semiconductor substrate 700 an electrode layer 708 is formed comprising a pattern 710 of conductive traces 712 formed of at least partially joined nanoparticles defining randomly-shaped cells 714, generally free of the partially joined nanoparticles and transparent to light. Semiconductor substrate 700, electrode 704, and electrode layer 708 correspond to semiconductor substrate 100, electrode 104 and electrode layer 108 of FIG. 1 and are as described with respect to FIG. 1.

As is described above in connection with electrode layer 108 of FIG. 1, electrode layer 708 is preferably formed from a coated emulsion containing conductive nanoparticles. The light transmitting cells 714 and the surrounding traces 712 have a network-like character and are observable with light microscopy.

In the illustrated embodiment of FIG. 7, there is provided over electrode layer 708 an additional semiconductor layer 720 and there is formed over additional semiconductor layer 720 an additional electrode layer 728 comprising a pattern 730 of conductive traces 732 formed of at least partially joined nanoparticles defining randomly-shaped cells 734, generally free of the partially joined nanoparticles and transparent to light. Like electrode layer 708, electrode layer 728 is preferably formed from a coated emulsion containing conductive nanoparticles. The light-transmitting cells 734 and surrounding traces 732 have a network-like character and are observable with light microscopy.

Electrode layers 708 and 728 correspond to electrode layer 108 in FIG. 1 and are as described in connection with FIG. 1, however It is appreciated that electrode layer 728 and electrode 704 and electrode 708 typically have work functions that differ from each other.

Semiconductor layers 700 and 720 may comprise materials as described in connection with semiconductor layer 100 in FIG. 1, but are different from each other. The device shown in FIG. 7 is a novel embodiment of a tandem photovoltaic device, also known as a multi-junction photovoltaic device, wherein two or more layers of different semiconductor materials with different band gaps are arranged in a stack. Where only one side of the device directly receives incoming light, the higher band gap material is preferably on that side, absorbing high-energy photons. Lower-energy photons are absorbed by a lower band gap material or materials lying beneath the higher band gap materials.

As is the case with the devices of FIGS. 1-6, the device shown in FIG. 7 may stand alone or may be formed on or placed on a flexible or rigid substrate as described in connection with FIG. 1.

Reference is now made to FIG. 8, which is a simplified illustration of a device for converting light to electricity in accordance with another embodiment of the invention.

As seen in FIG. 8, the device for converting light to electricity preferably comprises a semiconductor substrate 800 having disposed on an underside surface 802 thereof and in effective electrical contact therewith, an electrode 804. There is disposed over the opposite surface 806 of semiconductor substrate 800 an electrode layer 808 comprising a pattern 810 of conductive traces 812 formed of collections of at least partially joined nanoparticles defining randomly-shaped cells 814, generally free of the partially joined nanoparticles and transparent to light. Areas 814 are preferably filled with a light transmissive filler 815. Semiconductor substrate 800, electrode 804, and electrode layer 807, and filler 815 correspond to semiconductor substrate 200, electrode 204, electrode layer 208, and filler 215 of FIG. 2 and are as described with respect to FIG. 2.

As is described above in connection with electrode layer 108 of FIG. 1, electrode layer 808 is preferably formed from a coated emulsion containing conductive nanoparticles. The light transmitting cells 814 and the surrounding traces 812 have a network-like character and are observable with light microscopy.

In the illustrated embodiment of FIG. 8, there is provided over electrode layer 808 and filler 815 at surface 816 an additional semiconductor layer 820. There is disposed over additional semiconductor layer 820 an additional electrode layer 828 comprising a pattern 830 of conductive traces 832 formed of at least partially joined nanoparticles defining randomly-shaped cells 834, generally free of the partially joined nanoparticles and transparent to light.

Like electrode layer 808, electrode layer 828 is preferably formed from a coated emulsion containing conductive nanoparticles. The light-transmitting cells 834 and surrounding traces 832 have a network-like character and are observable with light microscopy.

In accordance with the embodiment of FIG. 8, cells 834 are filled with a light-transmissive filler 835. Filler 835 corresponds to filler 215 in FIG. 2 and is a described in connection with FIG. 2.

The device shown in FIG. 8 is another example of a tandem photovoltaic device as described in connection with FIG. 7, and is analogous thereto except for the presence of filler 815 and filler 835.

As is the case with the devices of FIGS. 1-7, the device shown in FIG. 8 may stand alone or may be formed on or placed on a flexible or rigid substrate as described in connection with FIG. 1.

Figure 9:
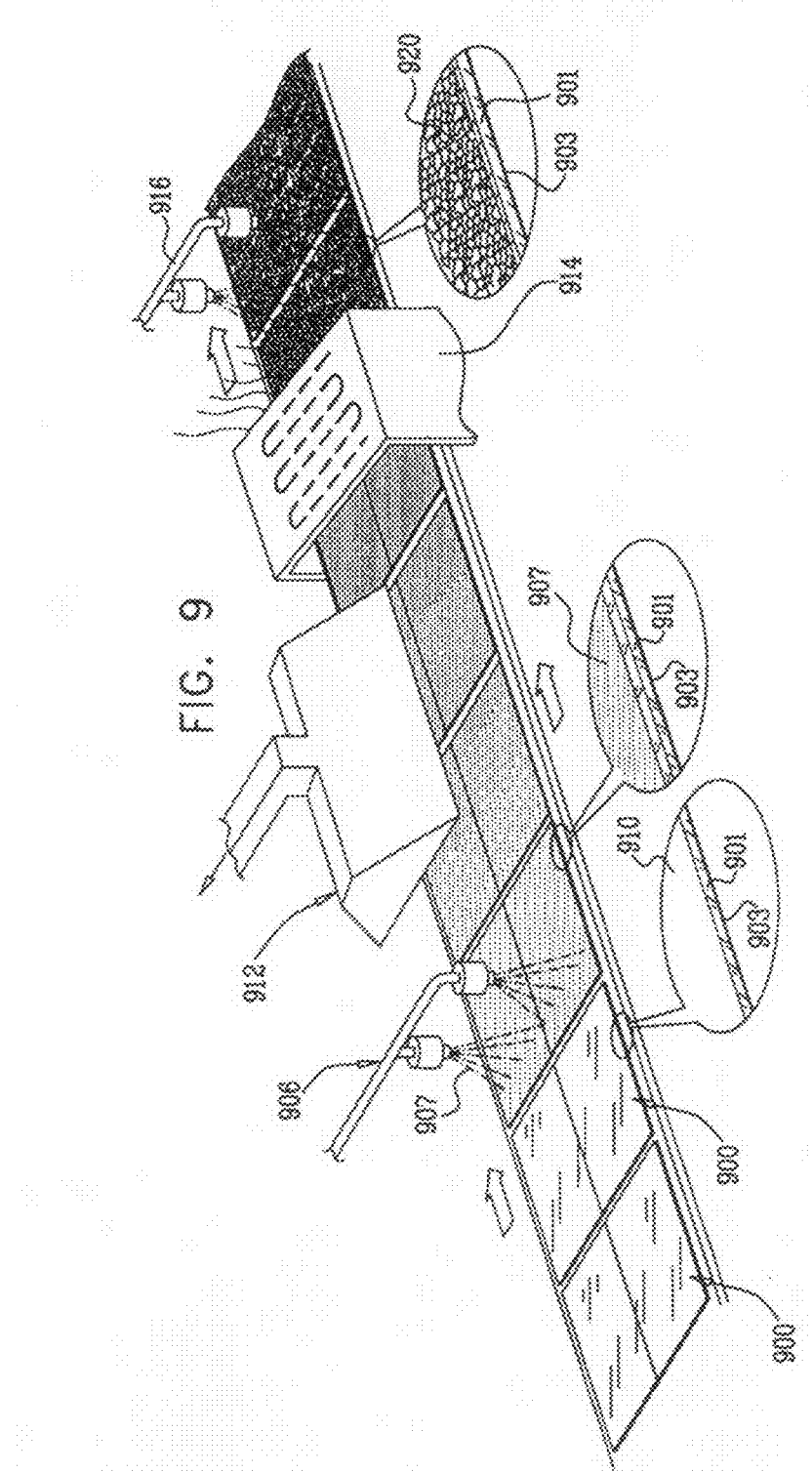
FIG. 9 is a simplified diagram of a process for manufacturing devices for converting light to electricity in accordance with the invention.

Reference is now made to FIG. 9 which is a simplified diagram of a process for manufacturing devices, such as the devices shown in any of FIGS. 1-8, for converting light to electricity. As seen in FIG. 9, a plurality of semiconductor substrate assemblies 900 are provided. The substrate assemblies 900 include a semiconductor substrate 901, similar to semiconductor substrates 100-800 described hereinabove, and having formed thereon an electrode layer 903, which may be identical to any of electrode layers 104-804 described hereinabove. Typically, the semiconductor substrate 901 has a thickness of up to approximately 1 mm and the electrode layer 903 has a thickness of up to approximately 2 microns.

Semiconductor substrate assemblies 900 are supplied to an emulsion coating station 906. At emulsion coating station 906, an emulsion 907 is applied to a surface 910 of the semiconductor substrate assembly 900 opposite to that on which electrode layer 903 is formed.

The emulsion 907 is as described above in connection with the embodiment of FIG. 1, i.e., preferably a water-in-oil emulsion containing a water or water-miscible phase, an organic solvent phase, and nanoparticles having conductive properties when they are partially joined.

The emulsion 907 can be applied at emulsion coating station 906 by any suitable technique such as bar spreading, immersing, spincoating, or dipping. Additional techniques that may be employed for applying the emulsion 907 include, for example, bar-coating, screen-printing, ink-jet printing, spin-coating, dip-coating, spray-coating, gravure printing, roll-coating, and blade coating. Laboratory-scale or industrial processes can be employed at emulsion coating station 906, utilizing single or multiple pass coating equipment.

Moreover, according to one embodiment of the present invention, the step of spreading of an emulsion on a surface 910 to be coated provides a wet emulsion thickness of 1 to 200 microns and more preferably 5 to 200 microns.

The surface 910 on which the emulsion 907 is deposited may be pretreated, for example by heating, etching, corona treatment, or oxidation or combinations thereof. The surface 910 may be given a preliminary coating, for example, it may be coated first with a suitable primer.

It is a particular feature of the present invention that the step of applying an emulsion to a surface can be performed without direct contact of the surface by a coating instrument. For example, coating using a knife gap-coater, an air knife coater, a comma coater, a slot die or a curtain coater does not require direct contact with the substrate surface 910 by a coating instrument. This is in contrast to screen-printing, gravure printing, and bar-coating, which typically involve direct contact with the substrate. When non-contact printing techniques are employed, delicate or sensitive features that are present on the substrate surface 910 are less prone to damage or deformation.

In accordance with a preferred embodiment of the present invention, the following steps may be followed: Applying the emulsion 907 to surface 910; evaporating solvent from the emulsion 907, with or without the application of heat, as indicated at reference numeral 912; and sintering the remaining coating at a temperature within the range of about room temperature to about 850° C. as indicated at reference numeral 914, thereby providing an electrode layer 920 over the surface 910. Sintering preferably takes place at ambient atmospheric pressure.

Alternatively or additionally, all or part of the sintering process indicated at reference numeral 914 can take place in the presence of a chemical that induces the sintering process. Examples of suitable chemicals include formaldehyde or acids, such as formic acid, acetic acid, and hydrochloric acid. The chemical may be in the form of a vapor or a liquid to which the deposited particles are exposed. Alternatively, such chemicals may be incorporated into the composition comprising the nanoparticles prior to deposition, or may be deposited on the nanoparticles after depositing the particles on the substrate.

The process may also include a post-sintering treatment step, as indicated at reference numeral 916, in which the electrode layer 920 may be further sintered, annealed, or otherwise post-treated using thermal, laser, UV, acid or other treatments and/or exposure to chemicals such as metal salts, bases, or ionic liquids. The treated electrode layer 920 may be washed with water or other suitable liquids.

Electrode layer 920 is characterized by a pattern of conductive traces formed of collections of at least partially joined nanoparticles defining randomly-shaped cells that are generally transparent to light and are observable by light microscopy, as mentioned with reference to FIGS. 1-8.

Electrode layer 920 is further characterized by sheet resistances after sintering between 0.005 Ω/square to 5 KΩ/square, preferably less than 50 ohm/sq, more preferably less than 20 ohm/sq, and most preferably less than or equal to 10 ohm/sq. Sheet resistance may be further reduced using techniques such as electroplating of electrode layer 920.

It is also a particular feature of the present invention that formation of the electrode layer 920 may employ low temperature deposition and treatment methodologies at temperatures of up to about 350° C. Low temperature liquid phase processing may be carried out at relatively low cost, especially when electrode layers 920 are being formed on large scale surfaces 910 and allow the use of heat-sensitive substrates such as certain polymeric substrates.

It is also a particular feature of the present invention that formation of the electrode layer 920 may be controlled in order to get different cell sizes and adjust them to obtain optimum photovoltaic device performance.

Figure 10:
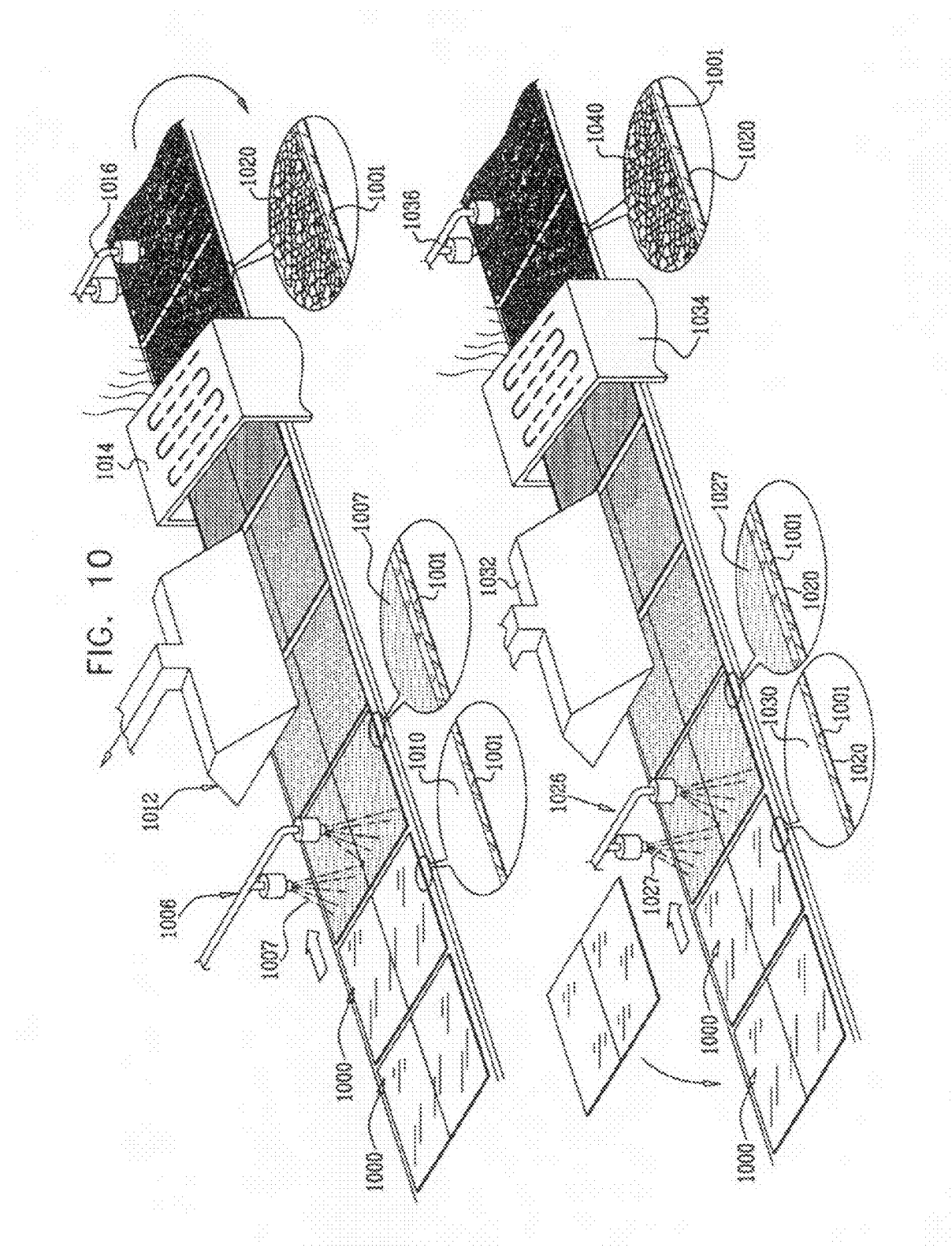
FIG. 10 is a simplified diagram of a process for manufacturing devices for converting light to electricity in accordance with another embodiment wherein patterned electrodes are provided on opposite sides of the device.

Additional device layers or features can be applied or formed by a variety of techniques, such as deposition from solution, coating by any of the methods described above, and direct printing, e.g. ink-jet or roll-to-roll printing. Other deposition and feature-forming methods, for example vapor deposition, lithography, optical lithography, etching, solubilization, vacuum sublimation, metal deposition by vacuum evaporation, sputtering, ion bombardment, electroplating, electroless plating, laser patterning, laser ablation or combinations of the foregoing can also be used to create additional layers or features, Reference is now made to FIG. 10, which is a simplified diagram of a process for manufacturing devices, such as the devices shown in any of FIGS. 1-8, for converting light to electricity in accordance with another embodiment. As seen in FIG. 10, a plurality of semiconductor substrate assemblies 1000 are provided. The substrate assemblies 1000 include a semiconductor substrate 1001, similar to semiconductor substrates 100-800 described hereinabove. Typically, the semiconductor substrate 1001 has a thickness of up to approximately 1 mm.

Semiconductor substrate assemblies 1000 are supplied to an emulsion coating station 1006. At emulsion coating station 1006, an emulsion 1007 is applied to a surface 1010 of the semiconductor substrate assembly 1000.

As mentioned above, the emulsion 1007 is preferably a water-in-oil emulsion containing a water- or water-miscible phase, an organic solvent phase, and nanoparticles having conductive properties when they are partially joined.

The emulsion 1007 can be applied at emulsion coating station 1008 in a manner similar to that described above in connection with FIG. 9, and the surface 1010 on which the emulsion 1007 is deposited may be pretreated as previously described.

After the emulsion 1007 is applied, evaporation of the solvent (at 1012), sintering (at 1014), and possible post-sintering treatment steps (at 1016) are carried out as described above in connection with FIG. 9. Sheet resistance of the electrode layer 1020 is characterized as described above in connection with electrode layer 920 of FIG. 9, and the resistance may be reduced by techniques such as electroplating, and additional device layers and features may be added as described above in connection with FIG. 9.

Downstream of formation of electrode layer 1020, the semiconductor substrate 1000, having electrode layer 1020 formed thereon, is preferably flipped over and fed, electrode layer 1020 downward in the sense of FIG. 10, to an emulsion coating station 1026. At emulsion coating station 1026, an emulsion 1027 is applied to a surface 1030 of the semiconductor substrate assembly 1000 opposite to that on which electrode layer 1020 is formed.

Emulsion 1027 is preferably a water-in-oil emulsion as described above in connection with emulsion 1007, but is selected to provide an electrode layer with a different work function than the electrode layer formed from emulsion 1007.

The emulsion 1027 can be applied at emulsion coating station 1026 as described above with respect to emulsion 1007.

The surface 1030 on which the emulsion 1027 is deposited may be pretreated as described above. After the emulsion 1007 is applied, evaporation of the solvent (at 1032), sintering (at 1034), and possible post-sintering treatment steps (at 1036) are carried out as described above in connection with FIG. 9. Sheet resistance of the electrode layer 1040 is characterized as described above in connection with electrode layer 920 of FIG. 9, and the resistance may be reduced by techniques such as electroplating. Additional device layers and features may be added as described above in connection with FIG. 9.

It is appreciated that electrode layer 1020 and electrode layer 1040 typically have work functions that differ from each other. It is a particular feature of the embodiment of FIG. 10 that the process provides a device with at least two electrodes that are light transmitting and are located on opposite sides of a semiconductor substrate.

Figure 11:
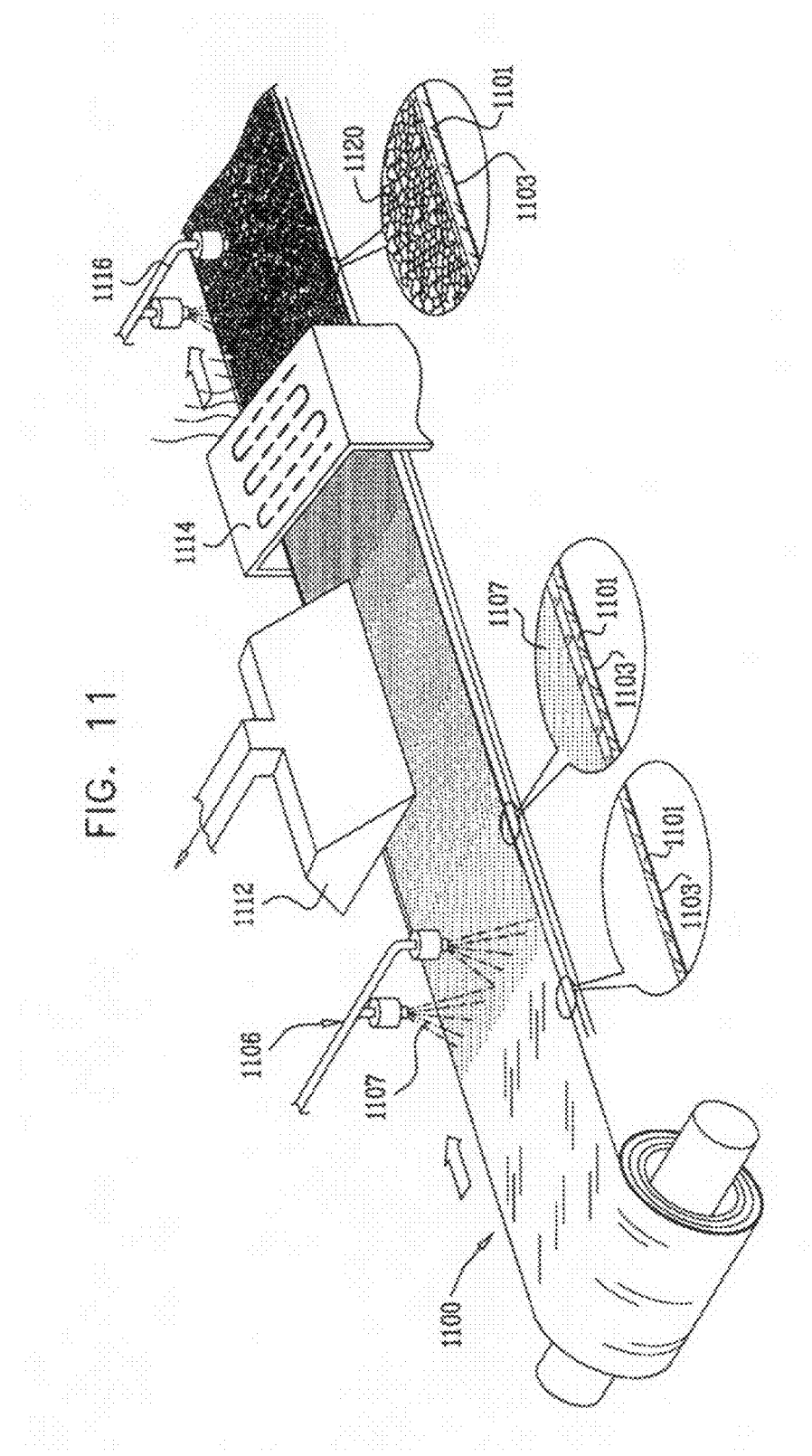
FIG. 11 is a simplified diagram of a process for manufacturing devices for converting light to electricity in accordance with another embodiment wherein the patterned electrode is formed onto a semiconductor assembly substrate roll in a continuous manner.

Reference is now made to FIG. 11, which is a simplified diagram of a roll-to-roll process for manufacturing devices, such as the devices shown in any of FIGS. 1-8, for converting light to electricity in accordance with another embodiment of the invention. As seen in FIG. 11, a continuous semiconductor substrate assembly 1100 is provided. The substrate assembly 1100 includes a semiconductor substrate 1101, similar to semiconductor substrates 100-800 described hereinabove, having formed thereon an electrode layer 1103, which may be identical to any of electrode layers 104-804 described hereinabove.

Semiconductor substrate assembly 1100 is supplied to an emulsion coating station 1106. At emulsion coating station 1106, an emulsion 1107 is applied to a surface 1110 of the semiconductor substrate assembly 1100 opposite to that on which electrode layer 1103 is formed.

Emulsion 1107 is preferably a water-in-oil emulsion as described above in connection with emulsion 907.

The emulsion 1107 can be applied at emulsion coating station 1106 as described above with respect to emulsion 907.

The surface 1110 on which the emulsion 1107 is deposited may be pretreated as described above. After the emulsion 1107 is applied, evaporation of the solvent (at 1112), sintering (at 1114), and possible post-sintering treatment steps (at 1116) are carried out as described above in connection with FIG. 9. Sheet resistance of the electrode layer 1120 is characterized as described above in connection with electrode layer 920 of FIG. 9, and the resistance may be reduced by techniques such as electroplating. Additional device layers and features may be added as described above in connection with FIG. 9.

It is appreciated that the continuous semiconductor assembly may be formed on a flexible web of flexible material, such as a flexible polymer, plastic or elastomer structure or a fabric, paper, or fiber backing, or metal foil, or flexible glass coated material. Flexible substrates may include polymers such as a polyester, polyamide, polyimide, polycarbonate, polyolefin, polyacrylate, polymethyl methacrylate (PMMA), a copolymer, or mixtures thereof.

Figure 12:
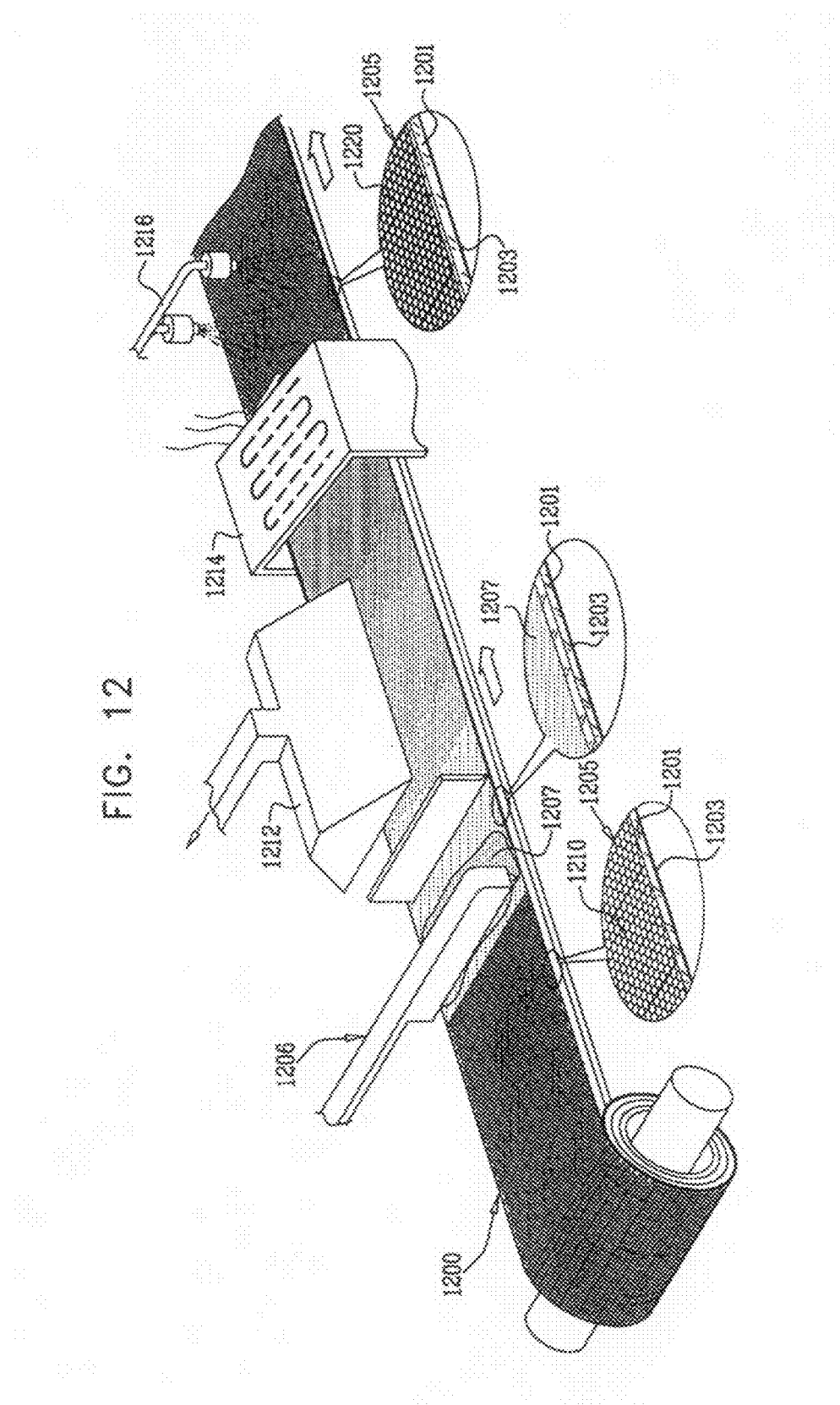
FIG. 12 is a simplified diagram of a process for manufacturing devices for converting light to electricity in accordance with another embodiment wherein the semiconductor substrate assembly roll has a pre-patterned surface.

Reference is now made to FIG. 12, which is a simplified diagram of a process for manufacturing devices, such as the devices shown in any of FIGS. 1-8, for converting light to electricity in accordance with another embodiment. As seen in FIG. 12, a semiconductor substrate assembly 1200 is provided. The substrate assembly 1200 may be provided in a continuous form or as a plurality of individual substrates. The substrate assembly 1200 includes a semiconductor substrate 1201, similar to semiconductor substrates 100-800 described hereinabove, having formed thereon an electrode layer 1203, which may be identical to any of electrode layers 104-804 described hereinabove.

A surface 1210 of the semiconductor substrate assembly 1200 is opposite to that on which electrode layer 1203 is formed. It is a particular feature of the embodiment of FIG. 12 that surface 1210 contains patterned channels pre-formed by etching, scraping, marking, lithography, or other suitable method. The channels form pattern 1205 on surface 1210. These channels will cause the nanoparticles in the emulsion to preferentially assemble in the channels after the emulsion is applied to the surface 10 and the solvent evaporated.

Semiconductor substrate assembly 1200 is supplied to an emulsion coating station 1206. At emulsion coating station 1206, emulsion 1207 is applied to surface 1210 of the semiconductor substrate assembly 1200.

Emulsion 1207 is preferably a water-in-oil emulsion as described above. The emulsion 1207 can be applied at emulsion coating station 1206 as described above with respect to emulsion 907.

The surface 1210 on which the emulsion 1207 is deposited may be pretreated as described above. After the emulsion 1207 is applied, evaporation of the solvent (at 1212), sintering (at 1214), and possible post-sintering treatment steps (at 1216) are carried out as described above in connection with FIG. 9. Sheet resistance of the electrode layer 1220 is characterized as described above in connection with electrode layer 920 of FIG. 9, and the resistance may be reduced by techniques such as electroplating. Additional device layers and features may be added as described above in connection with FIG. 9.

It is another particular feature of the embodiment of FIG. 12 that upon evaporation of the solvent from emulsion 1207, the nanoparticles in the remaining coating will preferentially fill, or at least partially fill, the channels of pattern 1205.

Figure 13:
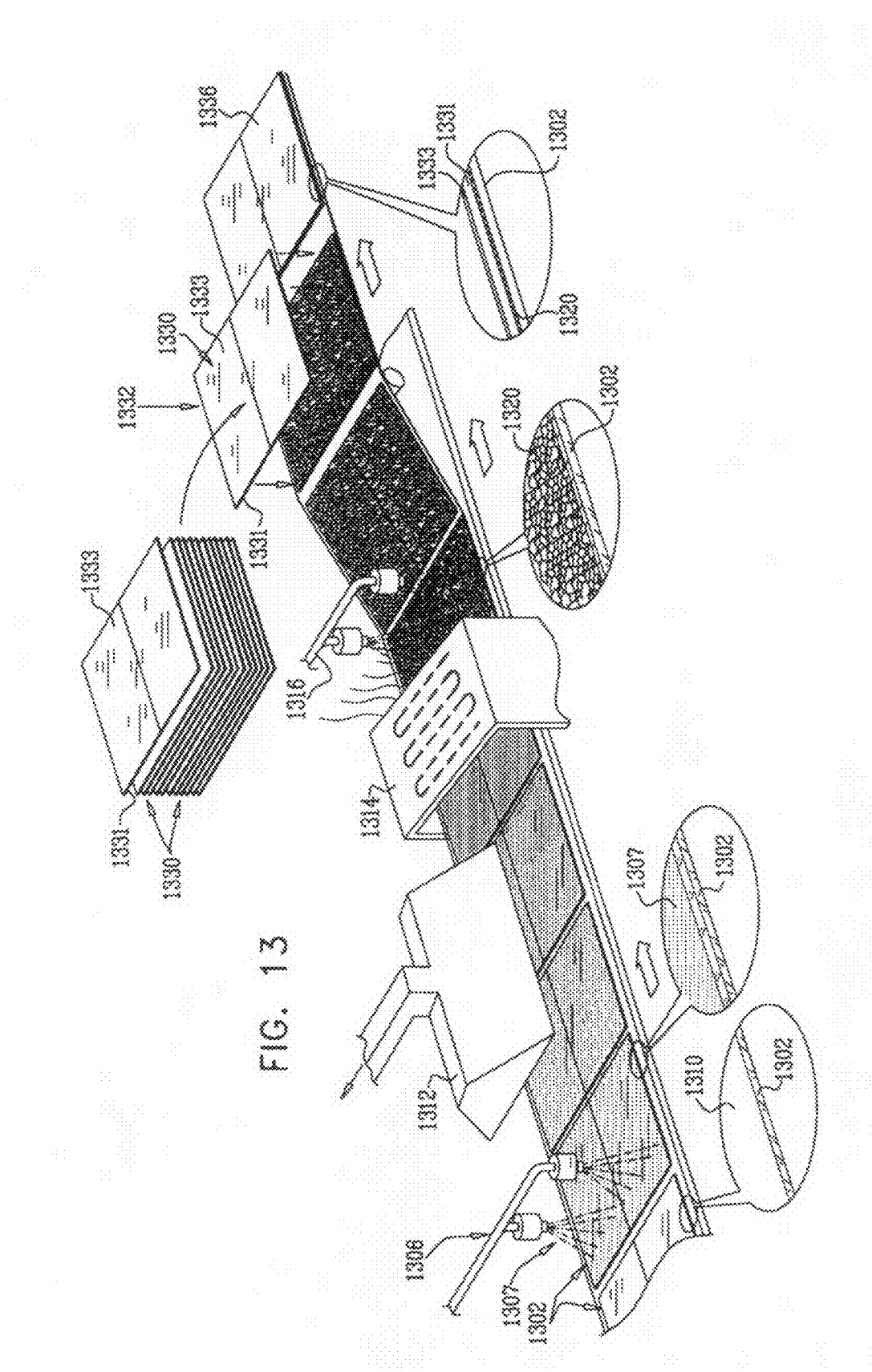
FIG. 13 is a simplified diagram of a process for manufacturing devices for converting light to electricity in accordance with another embodiment wherein the patterned electrode is formed on a substrate and subsequently combined with a prefabricated semiconductor assembly to form the photovoltaic device.

Reference is now made to FIG. 13, which is a simplified diagram of a process for manufacturing devices, such as the devices shown in any of FIGS. 1-8, for converting light to electricity in accordance with another embodiment. As seen in FIG. 13, a substrate assembly or plurality of substrate assemblies 1302 are provided.

Substrate assembly 1302 may be flexible or rigid such as glass, paper, ceramic and fabric. Such substrate may include a polymer such as a polyester, polyamide, polyimide, polycarbonate, polyolefin, polyacrylate, polymethyl methacrylate (PMMA), a copolymer, or mixtures thereof. The substrate 1302 may have a flat surface or a curved surface, and the surface may be smooth or rough. Substrate 1302 may be light transmitting.

Substrate assembly 1302 is supplied to an emulsion coating station 1306. At emulsion coating station 1306, an emulsion 1307 is applied to a surface 1310 of the substrate assembly 1302.

Emulsion 1307 is preferably a water-in-oil emulsion as described above. The emulsion 1307 can be applied at emulsion coating station 1206 as described above with respect to emulsion 907.

The surface 1310 on which the emulsion 1307 is deposited may be pretreated as described above. After the emulsion 1307 is applied, evaporation of the solvent (at 1312), sintering (at 1314), and possible post-sintering treatment steps (at 1316) are carried out as described above in connection with FIG. 9. Sheet resistance of the electrode layer 1320 is characterized as described above in connection with electrode layer 920 of FIG. 9, and the resistance may be reduced by techniques such as electroplating. Additional device layers and features may be added as described above in connection with FIG. 9.

Downstream of the formation of electrode layer 1320, a semiconductor substrate assembly 1330 or a plurality of semiconductor substrate assemblies 1330 are supplied to a fabrication station 1332. The substrate assembly 1330 includes a semiconductor substrate 1331, similar to semiconductor substrates 100-800 described hereinabove, and having formed thereon an electrode layer 1333, which may be identical to any of electrode layers 104-804 described hereinabove.

At fabrication station 1332, substrate assembly 1330 is placed on electrode layer 1320 such that semiconductor substrate 1331 is in electrical contact with electrode layer 1320. The combined parts form photovoltaic device 1336.

It is a particular feature of the embodiment of FIG. 13 that the emulsion 1307 is coated or otherwise deposited onto a substrate to form electrode 1320 and that the coated substrate with electrode 1320 is then incorporated with a prefabricated part of a photovoltaic device in a separate fabrication step.

Figure 14:
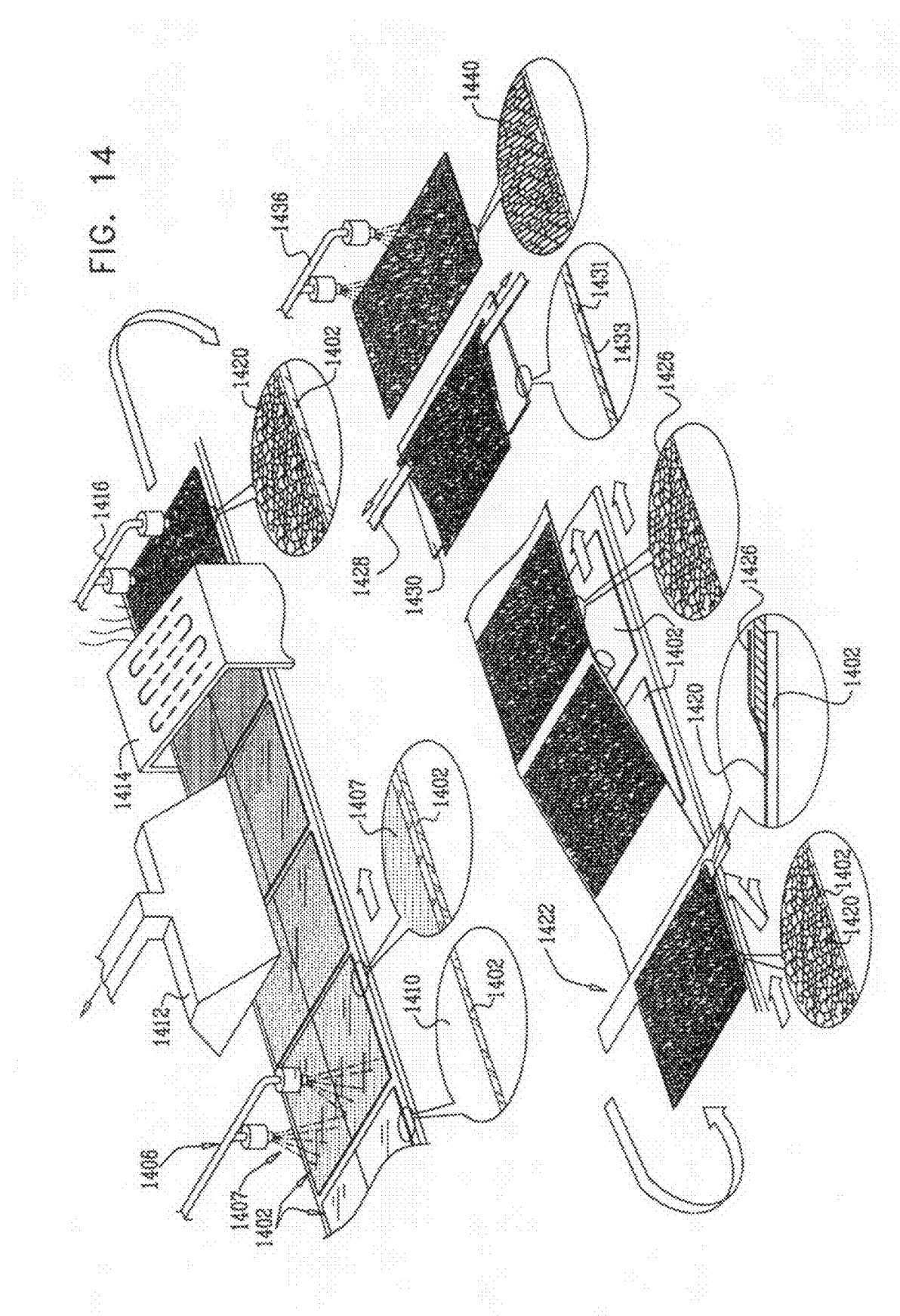
FIG. 14 is a simplified diagram of a process for manufacturing devices for converting light to electricity in accordance with another embodiment wherein the patterned electrode formed on a substrate is subsequently removed from the substrate and transferred to a semiconductor assembly.

Reference is now made to FIG. 14, which is a simplified diagram of a process for manufacturing devices, such as the devices shown in any of FIGS. 1-8, for converting light to electricity in accordance with another embodiment. As seen in FIG. 14, a substrate assembly or plurality of substrate assemblies 1402 are provided.

Substrate assembly 1402 may be flexible or rigid such as glass, paper, ceramic and fabric. Such substrate may include a polymer such as a polyester, polyamide, polyimide, polycarbonate, polyolefin, polyacrylate, polymethyl methacrylate (PMMA), a copolymer, or mixtures thereof. The substrate 1402 may have a flat surface or a curved surface, and the surface may be smooth or rough.

Substrate assembly 1402 is supplied to an emulsion coating station 1406. At emulsion coating station 1406, an emulsion 1407 is applied to a surface 1410 of the substrate assembly 1402.

Emulsion 1407 is preferably a water-in-oil emulsion as described above. The emulsion 1407 can be applied at emulsion coating station 1206 as described above with respect to emulsion 907.

The surface 1410 on which the emulsion 1407 is deposited may be pretreated as described above. After the emulsion 1407 is applied, evaporation of the solvent (at 1412), sintering (at 1414), and possible post-sintering treatment steps (at 1416) are carried out as described above in connection with FIG. 9. Sheet resistance of the electrode layer 1420 is characterized as described above in connection with electrode layer 920 of FIG. 9, and the resistance may be reduced by techniques such as electroplating. Additional device layers and features may be added as described above in connection with FIG. 9.

At an electrode removal station 1422, electrode layer 1420 is separated from substrate assembly 1402, forming a separated electrode layer 1426. Separation of electrode layer 1420 from substrate assembly 1402 may be accomplished by physical methods such as scraping, peeling, knife separating, or floating, or by chemical methods, such as dissolution or heating of a release agent. The presence of a release agent or release layer or the absence of an adhesion agent can also be used to allow for removal of electrode layer 1420.

The process may also include a deformation step as indicated at reference numeral 1428, in which the electrode layer 1426 is elongated or deformed so as to change the shape of the light transmitting areas within the pattern of conductive traces. For example, elongation can orient and increase the aspect ratio of the cells in the pattern as illustrated by pattern 1440.

The separated electrode layer 1426 with pattern 1420 or 1440 may be transferred to a semiconductor substrate assembly 1430. The substrate assembly 1430 includes a semiconductor substrate 1431, similar to semiconductor substrates 100-800 described hereinabove, and having formed thereon an electrode layer 1433, which may be identical to any of electrode layers 104-804 described hereinabove. Additional treatment steps can be carried out as described in connection with FIG. 9.

Figure 15:
FIG. 15 is an optical micrograph of a transparent conductive coating on a silicon nitride layer on a silicon substrate.

Reference is now made to FIG. 15, which is an optical micrograph of a transparent conductive coating in accordance with the invention. The substrate consisted of a standard n-doped (P) 4-inch Si wafer. Before application of the emulsion, the substrate was treated for at least two minutes in a 3:1 sulfuric acid:hydrogen peroxide solution (standard piranha solution). Sulfuric acid concentration was 97%, while hydrogen peroxide concentration was 3%. The piranha treatment served the purpose of cleaning the surface and increasing the density of hydroxyl groups at the surface making the surface more hydrophilic. For this sample, the following emulsion formulation was used:

1.3 g of silver nanopowder
44 mg of antimony oxide nanopowder
125 mg of Span 60
122 mg of BYK410
1.72 g cyclohexanone
18 g toluene
10 g of 0.02% BYK 348 in DI water.

The coating was applied using a Mayer rod #4 kept at a distance of 50 um from the surface by means of two spacers formed from cellophane tape. The total wet thickness of the applied coating was around 60 um. After drying, the sample was baked at 800° C. The sheet resistance of this sample was ~1 ohm/square, with a transparency of 81%. The transparency was calculated from the optical micrograph using the image processing software ImageJ, and it refers to the fraction of the surface that is not shadowed by the TCC traces.

It will be appreciated by those skilled in the art that other devices that require transmission of visible, NIR, IR, and/or UV regions of the electromagnetic spectrum, including for example, photodiodes; photoconductors; light sensors; light emitting diodes (LEDs), including organic light emitting diodes; and lasers, as well as specialized transistors, including inorganic transistors, organic transistors, or hybrid transistors can be made with the patterned transparent electrode used in the present invention. Other applications for which the invention can be utilized include, but are not limited to, the following categories: printed electronics, display backplanes and touch screens, and large or small area flexible applications. Flexible applications further include large area arrays, textiles or active clothing, flexible displays, and e-paper (electronic books, journals, newspapers). Applications further include monitoring or detection devices for healthcare, safety, or security uses, including low-cost or disposable sensors or optical devices, as well as in smart packaging such as for incorporation of tags, indicators, or RFID components into the packaging. The invention can be used in devices for outdoor environments and outdoor equipment such as in military, camp, or remote or temporary facilities, or for sea or space applications. The devices can be used in various military constructions, such as rockets, planes, or munitions. In addition, the technology can be employed in building applications such as smart windows and panes, or in specialty paints and coatings which function as part of a semiconductor device.

What is claimed is:

1. A device for converting light to electricity comprising:
a substrate having a semiconductor surface;
a first electrode layer disposed over said semiconductor surface of said substrate and in electrical contact therewith comprising a self-assembled pattern of conductive traces formed by drying a liquid emulsion comprising nanoparticles, wherein the conductive traces comprise at least partially-joined nanoparticles and define randomly-shaped cells, wherein the randomly-shaped cells are generally free of said partially joined nanoparticles and generally transparent to light; and
a second electrode layer disposed on the opposite side of the substrate to that over which the first electrode layer is disposed and in electrical contact with said semiconductor.

2. The device of claim 1 further comprising transparent filler material within at least the cells.

3. The device of claim 1 further comprising an intermediate layer disposed between said substrate and the first electrode layer.

4. The device of claim 3 wherein the intermediate layer is a conductive polymer.

5. The device of claim 4 wherein the conductive polymer is PEDOT:PSS.

6. The device of claim 3 wherein the intermediate layer further comprises a material that enhances the adhesion of the first electrode to the semiconductor surface.

7. The device of claim 6 wherein the material for enhancing adhesion comprises glass fits, glass beads or silica.

8. The device of claim 6 wherein the intermediate layer further comprises a material for enhancing the electrical contact of the first electrode to the semiconductor surface.

9. The device of claim 1 and wherein resistance of the pattern of conductive traces is less than 30 ohm/sq.

10. The device of claim 1 wherein the ratio of the average cell diameter to the thickness of the semi-conductive substrate is approximately 1:2.

11. The device of claim 1 wherein the percentage of the surface of the semiconductor that does not receive incoming light is not higher than 15 percent.

12. The device of claim 1 wherein doping agents are included within the randomly-shaped cells.

13. The device of claim 1 wherein the traces have an aspect ratio of 1:5 or higher, height to width.

14. The device of claim 1 wherein the traces generally have line widths narrower than 50 um.

15. The device of claim 1, wherein the cells generally have diameters smaller than 500 um.

16. The device of claim 1 further comprising a second semiconductor substrate disposed over the first electrode layer on the side opposite the side disposed over the first semiconductor substrate and a third electrode disposed over the second semiconductor substrate on the side opposite that disposed over the first electrode layer, the first and the third electrodes comprising a pattern of conductive traces formed of at least partially joined nanoparticles defining randomly-shaped cells, generally free of said partially joined nanoparticles, which cells are generally transparent to light; and the first, second and third electrode layers have functionality differing from one another.

17. The device of claim 1 wherein the second electrode also comprises a pattern of conductive traces formed of at least partially joined nanoparticles defining randomly-shaped cells, generally free of said partially joined nanoparticles, which cells are generally transparent to light; and the first and second electrode layers may have functionality differing from each another.

18. A device for converting light to electricity comprising:
a substrate having first and second surfaces;
a first electrode layer disposed over the first surface of the substrate and in electrical contact therewith comprising a pattern of conductive traces formed by drying a liquid emulsion comprising nanoparticles, wherein the conductive traces comprise at least partially joined nanoparticles defining randomly-shaped cells, wherein the randomly-shaped cells are generally free of said partially joined nanoparticles and generally transparent to light;
a semiconductor layer disposed at least in the cells; and
a second electrode layer disposed over the second surface and in electrical contact therewith.

19. A method for producing devices for converting light to electricity comprising:
providing a substrate having a semiconductor surface;
disposing a first electrode layer over the semiconductor surface of the substrate, wherein the first electrode layer is formed by coating an emulsion containing conductive nanoparticles over the substrate, drying the emulsion to form a pattern of traces defining randomly-shaped cells generally free of nanoparticles and generally transparent to light, and sintering the pattern to at least partially join the nanoparticles and render the pattern conductive; and
providing a second electrode layer disposed over the surface of the substrate opposite to that over which the first electrode layer is disposed and in electrical contact with the semiconductor.

20. The method of claim 19 wherein the emulsion is coated in a continuous process onto the semiconductor substrate in a roll-to-roll process.

* * * * *